(12) United States Patent
Demaratos

(10) Patent No.: US 11,183,804 B2
(45) Date of Patent: Nov. 23, 2021

(54) CONNECTOR SYSTEM AND ELECTRICAL CIRCUIT FOR CONNECTOR POSITION ASSURANCE MEMBER

(71) Applicant: J.S.T. CORPORATION, Farmington Hills, MI (US)

(72) Inventor: David Demaratos, Wixom, MI (US)

(73) Assignee: J.S.T. CORPORATION, Farmington Hills, MI (US)

( * ) Notice: Subject to any disclaimer, the term of this patent is extended or adjusted under 35 U.S.C. 154(b) by 0 days.

(21) Appl. No.: 16/518,255

(22) Filed: Jul. 22, 2019

(65) Prior Publication Data

US 2020/0028307 A1 Jan. 23, 2020

Related U.S. Application Data

(60) Provisional application No. 62/701,939, filed on Jul. 23, 2018.

(51) Int. Cl.
*H01R 24/66* (2011.01)
*H01R 43/26* (2006.01)
(Continued)

(52) U.S. Cl.
CPC ............. *H01R 24/66* (2013.01); *G01R 31/68* (2020.01); *H01R 13/6273* (2013.01);
(Continued)

(58) Field of Classification Search
CPC ............... H01R 13/639; H01R 13/641; H01R 13/6272; H01R 13/506; H01R 2201/26; H01R 13/6273; H01R 13/4362; H01R 13/4223; H01R 13/502; H01R 13/4365; H01R 13/5202; H01R 13/6275; H01R 13/5219; H01R 13/62938; H01R 43/26; H01R 13/432; H01R 13/4361; H01R 13/4367; H01R 13/6271; H01R 13/62955; H01R 13/4368; H01R 13/5221; H01R 13/631; H01R 13/64; H01R 13/424;
(Continued)

(56) References Cited

U.S. PATENT DOCUMENTS 6,361,356 B1   3/2002  Heberlein
6,648,669 B1 * 11/2003  Kim .................. H01R 13/6272
                                                              439/357

(Continued)

OTHER PUBLICATIONS

International Search Report for International Application No. PCT/US2019/042815 dated Nov. 1, 2019 (3 sheets).
(Continued)

*Primary Examiner* — Truc T Nguyen
(74) *Attorney, Agent, or Firm* — Kratz, Quintos & Hanson, LLP

(57) ABSTRACT

A connector position assurance (CPA) member for assuring the engagement of a first connector housing with a second connector housing. The CPA member includes terminals which can conduct electricity through a conductor in the second connector housing when the CPA member is at a full-lock position, due to a closed electrical circuit. The terminals of the CPA member cannot conduct electricity through the conductor in the second connector housing when the CPA member is at a pre-lock position due to an open electrical circuit.

20 Claims, 27 Drawing Sheets

(51) Int. Cl.
    *H01R 24/76*     (2011.01)
    *H01R 13/627*     (2006.01)
    *G01R 31/68*     (2020.01)
    *H01R 103/00*     (2006.01)
    *H01R 101/00*     (2006.01)

(52) U.S. Cl.
    CPC .............. *H01R 24/76* (2013.01); *H01R 43/26* (2013.01); *H01R 2101/00* (2013.01); *H01R 2103/00* (2013.01); *H01R 2201/20* (2013.01)

(58) Field of Classification Search
    CPC .............. H01R 13/428; H01R 13/5208; H01R 13/62966; H01R 2103/00; H01R 24/28; H01R 43/18; H01R 4/185; H01R 13/04; H01R 13/111; H01R 13/187; H01R 13/42; H01R 13/422; H01R 13/501; H01R 13/5025; H01R 13/5205; H01R 13/53; H01R 13/5812; H01R 13/62927; H01R 13/62977; H01R 13/6315; H01R 13/7032; H01R 2107/00; H01R 43/005; H01R 12/79; H01R 13/03; H01R 13/113; H01R 13/18; H01R 13/193; H01R 13/2442; H01R 13/28; H01R 13/41; H01R 13/426; H01R 13/436; H01R 13/4364; H01R 13/44; H01R 13/443; H01R 13/508; H01R 13/514; H01R 13/5829; H01R 13/6277; H01R 13/6278; H01R 13/629; H01R 13/62944; H01R 13/6295; H01R 13/6397; H01R 13/642; H01R 24/20; H01R 24/545; H01R 24/66; H01R 24/76; H01R 43/042; H01R 43/20; H01R 4/48; H01R 9/0518; H01R 9/2416; H01R 12/7052; H01R 12/716; H01R 12/722; H01R 12/737; H01R 13/05; H01R 13/052; H01R 13/11; H01R 13/112; H01R 13/207; H01R 13/245; H01R 13/26; H01R 13/40; H01R 13/4538; H01R 13/465; H01R 13/50; H01R 13/504; H01R 13/516; H01R 13/52; H01R 13/521; H01R 13/5213; H01R 13/533; H01R 13/567; H01R 13/5804; H01R 13/5816; H01R 13/582; H01R 13/5825; H01R 13/6215; H01R 13/62916; H01R 13/62961; H01R 13/6335; H01R 13/6392; H01R 13/6395; H01R 13/6453; H01R 13/6456; H01R 13/648; H01R 13/6581; H01R 13/6582; H01R 13/6588; H01R 13/6589; H01R 13/6592; H01R 13/6616; H01R 13/665; H01R 13/6666; H01R 13/6683; H01R 13/701; H01R 13/71; H01R 13/7137; H01R 13/748; H01R 2101/00; H01R 2201/20; H01R 24/38; H01R 24/60; H01R 24/84; H01R 33/965; H01R 43/16; H01R 4/184; H01R 4/2433; H01R 4/4818; H01R 4/5091; H01R 4/70; H01R 9/03

See application file for complete search history.

(56) References Cited

U.S. PATENT DOCUMENTS

| | | | |
|---|---|---|---|
| 7,326,074 | B1 | 2/2008 | Lim |
| 9,831,601 | B2* | 11/2017 | Kim ..................... H01R 13/639 |
| 10,153,586 | B1* | 12/2018 | Schroll ............. H01R 13/6272 |
| 2007/0197081 | A1 | 8/2007 | Paiierson |
| 2008/0124966 | A1* | 5/2008 | Lim ................... H01R 13/6272 |
| | | | 439/357 |
| 2009/0190318 | A1* | 7/2009 | Komatsu ............. H01R 12/707 |
| | | | 361/760 |
| 2012/0238124 | A1* | 9/2012 | Zhao ..................... B60L 3/0069 |
| | | | 439/350 |
| 2012/0282791 | A1 | 11/2012 | Brown |
| 2013/0078835 | A1* | 3/2013 | Gunreben ............... B60L 53/16 |
| | | | 439/188 |
| 2013/0309884 | A1* | 11/2013 | Pamart ............ H01R 13/65912 |
| | | | 439/108 |
| 2017/0077646 | A1 | 3/2017 | Kim |
| 2017/0310045 | A1 | 10/2017 | Nuetzel |
| 2018/0034197 | A1* | 2/2018 | Lyon ................. H01R 13/4361 |

OTHER PUBLICATIONS

Written Opinion of the International Searching Authority for International Application No. PCT/US2019/042815 dated Nov. 1, 2019 (6 sheets).

* cited by examiner

CONNECTOR SYSTEM AND ELECTRICAL CIRCUIT FOR CONNECTOR POSITION ASSURANCE MEMBER

CROSS-REFERENCE TO RELATED APPLICATIONS

This patent application claims priority to U.S. Provisional Patent Application No. 62/701,939, filed Jul. 23, 2018, which is hereby incorporated herein by reference in its entirety.

BACKGROUND OF THE INVENTION

The present invention generally relates to a connector system and electrical circuit for a connector position assurance member. The connector system can include a first connector housing, a second connector housing, and the connector position assurance member.

The connector position assurance member is for assuring the engagement of a first connector housing with a second connector housing. The first connector housing receives the connector position assurance member to assure the first and second connector housings are engaged with each other.

BRIEF SUMMARY OF THE INVENTION

A connector position assurance (CPA) member serves to assure the engagement of a first connector housing with a second connector housing. As an initial step, the CPA member is inserted into the first connector housing to be at a pre-lock position. That initial step can occur before the second connector housing is in contact with the first connector housing or after the second connector housing is in contact with the first connector housing.

If the first connector housing and the second connector housing are fully engaged together, the full engagement thereof is assured when the CPA member is placed at the full-lock position. That is, when the second connector housing is fully engaged with the first connector housing, the CPA member can be inserted further into the first connector housing and also into the second connector housing, such that the CPA member is at a full-lock position.

The full engagement of the first connector housing with the second connector housing is assured when the CPA member is at a full-lock position.

The CPA member of the present invention includes components of an electrical circuit at least in a first arm of the CPA member and in a second arm of the CPA member. When the CPA member is in the pre-lock position, there is an open circuit because the first arm is not connected electrically with the second arm. When the CPA member is in the full-lock position, there is a closed circuit because the first arm is connected electrically with the second arm through electrically conductive components located in the second connector housing. Equipment can be used to detect whether the electrical circuit is open or closed. When the electrical circuit is detected as being a closed circuit, this provides additional assurance that the first connector housing is fully engaged with the second connector housing and that the CPA member is in the full-lock position.

Additional features, advantages, and embodiments of the invention are set forth or are apparent from consideration of the following detailed description, drawings and claims. Moreover, it is to be understood that both the foregoing summary of the invention and the following detailed description are exemplary and intended to provide further explanations without limiting the scope of the invention as claimed.

DETAILED DESCRIPTION OF THE PREFERRED EMBODIMENTS

Figure 1:
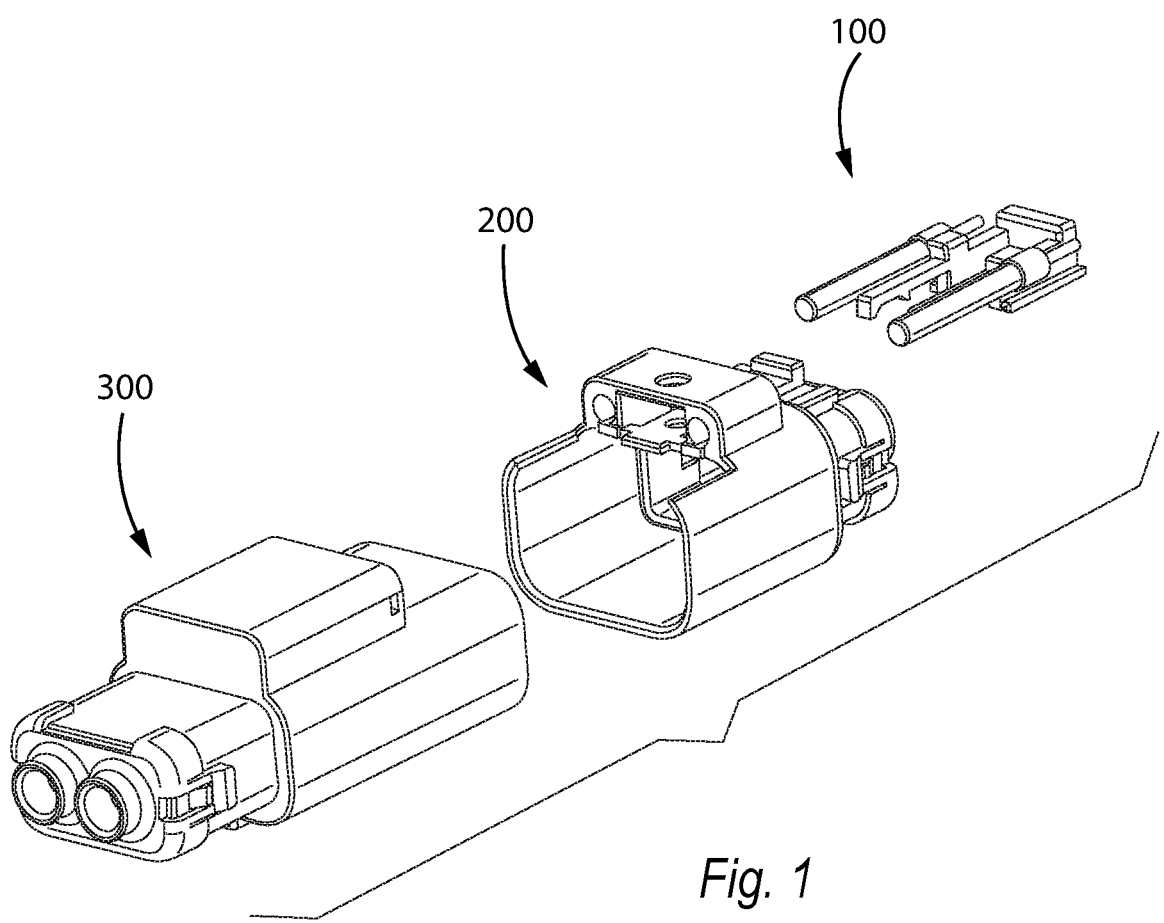
FIG. 1 is an exploded perspective view of a connector system in accordance with the principles of the present invention, showing a connector position assurance member, a first connector housing, and a second connector housing.

FIG. 1 is an exploded perspective view of a connector system in accordance with the principles of the present invention, showing a connector position assurance member, a first connector housing, and a second connector housing.

FIG. 1 illustrates a connector position assurance (CPA) member 100, a first connector housing 200, and a second connector housing 300. The first connector housing 200 can be referred to as a female connector housing 200. The second connector housing 300 can be referred to as a male connector housing 300.

Figure 2:
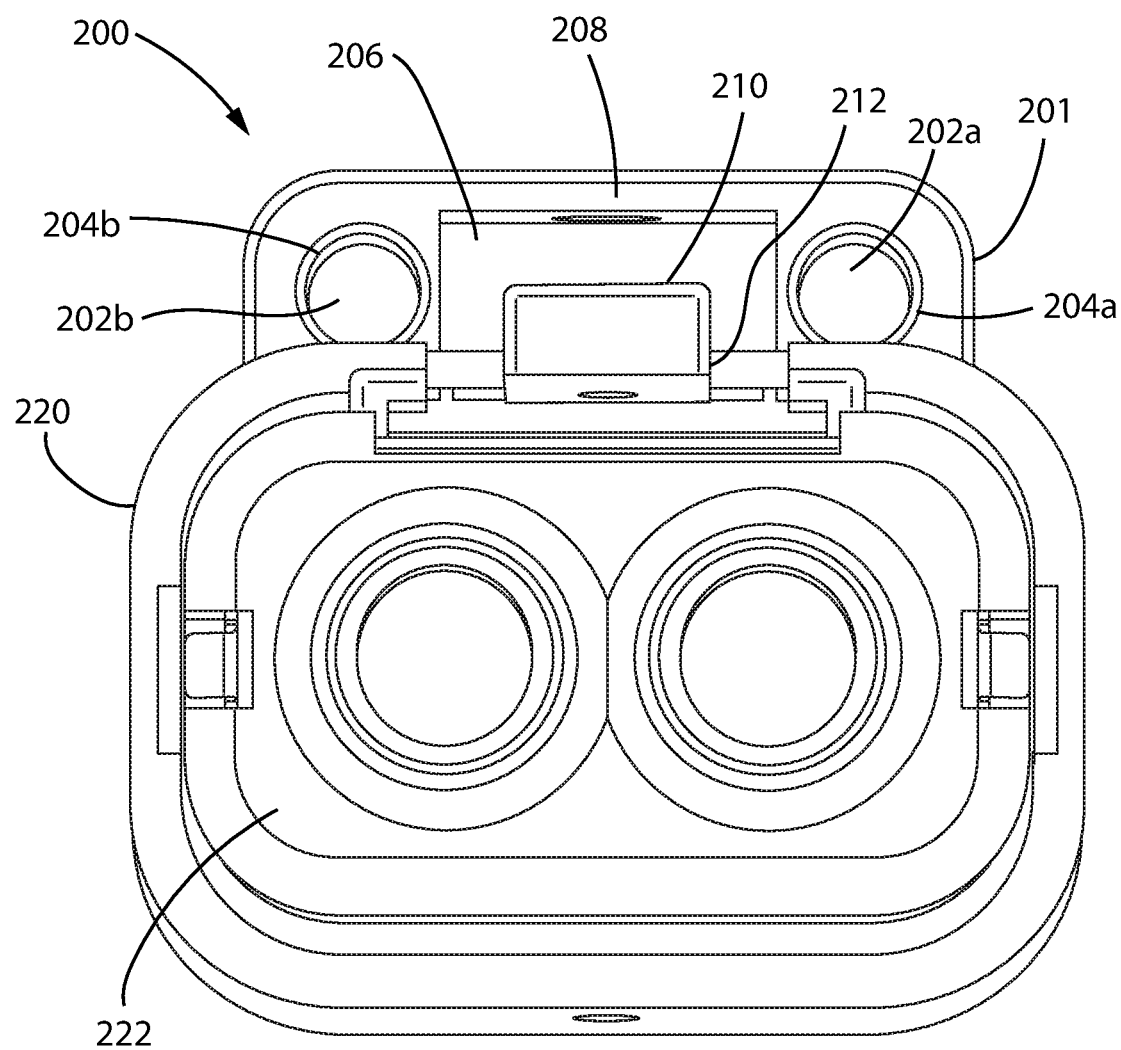
FIG. 2 is a front end elevational view of the first connector housing of FIG. 1.

FIG. 2 is a front end elevational view of the first connector housing 200 of FIG. 1. FIG. 2 illustrates the first connector housing 200, which has an upper central portion 201, a lateral opening 202a on the first side of upper central portion 201, a lateral opening 202b on the second side of upper central portion 201, an inner side wall 204a of lateral opening 202a, an inner side wall 204b of lateral opening 202b, a central opening 206 in the upper central portion 201, a central bridge 208 of the upper central portion 201, a rear upper projection 210 on an elongated flexible portion 212, a wall 220, and a rear end cover 222. The lateral openings 202a and 202b are through holes. The central opening 206 is a through hole.

Figure 3:
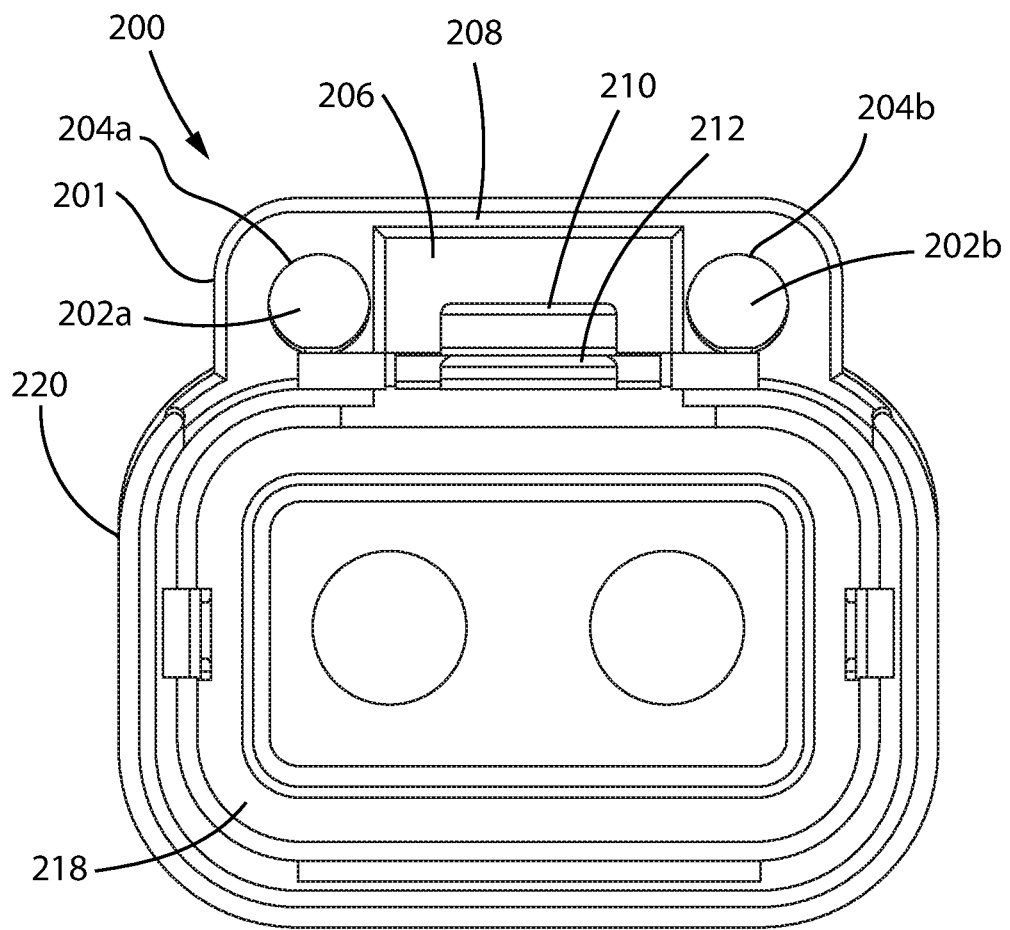
FIG. 3 is a rear end elevational view of the first connector housing of FIG. 1.

FIG. 3 is a rear end elevational view of the first connector housing 200 of FIG. 1. FIG. 3 illustrates an opening 218 of the first connector housing 200.

Figure 4:
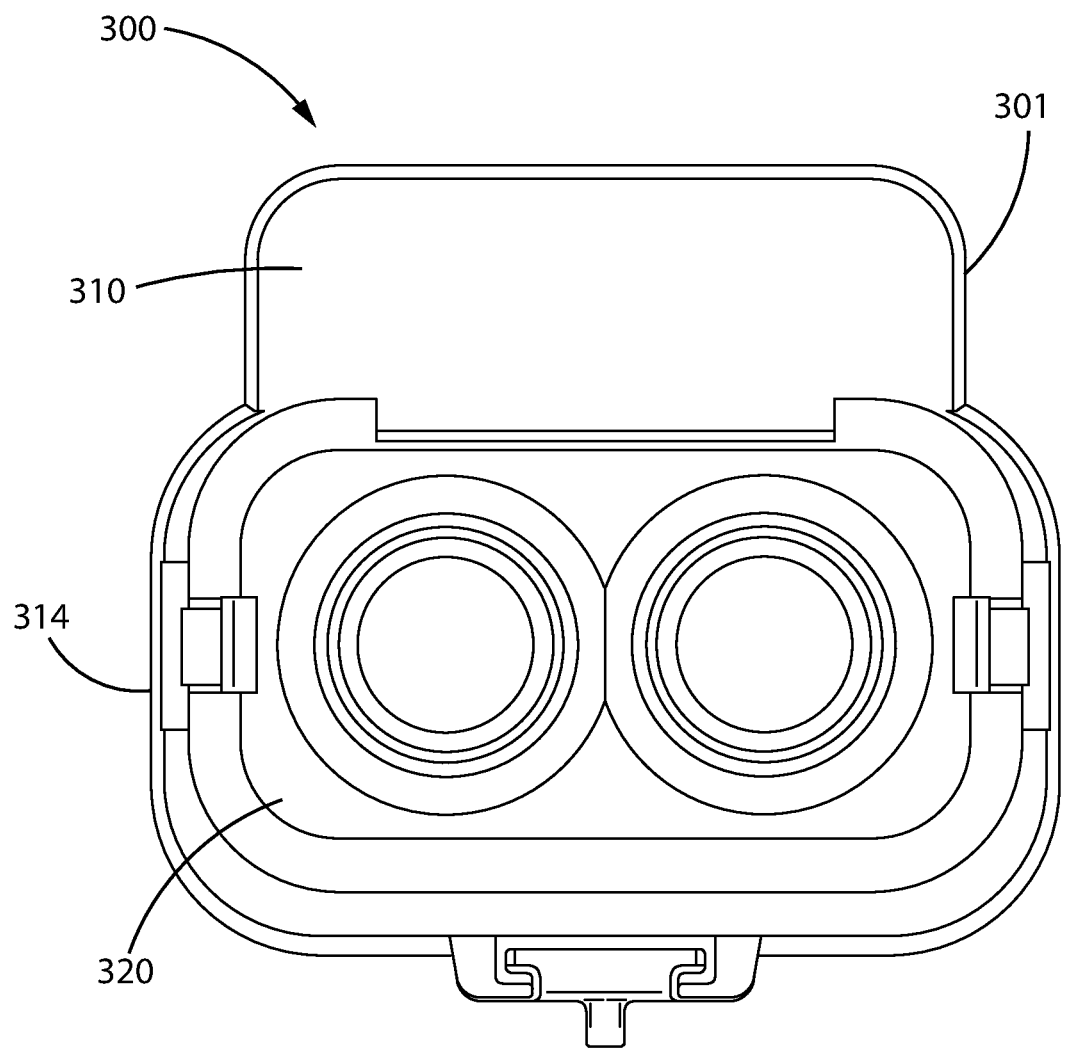
FIG. 4 is a rear end elevational view of the second connector housing of FIG. 1.

FIG. 4 is a rear end elevational view of the second connector housing 300 of FIG. 1. FIG. 4 illustrates the second connector housing 300, which has an upper central portion 301, a rear wall 310 of the upper central portion 301, a side wall 314, and a rear end cover 320.

Figure 5:
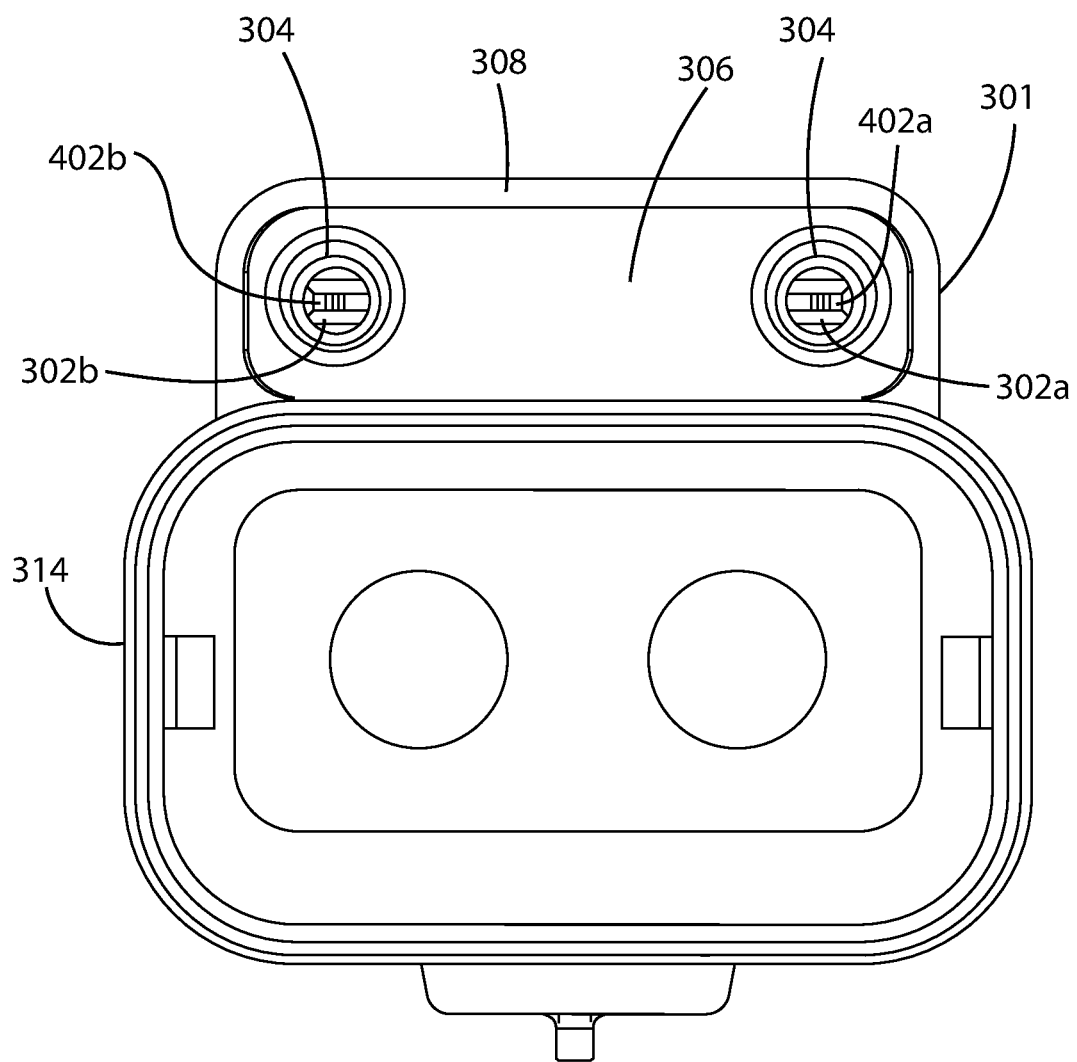
FIG. 5 is a front end elevational view of the second connector housing of FIG. 1.

FIG. 5 is a front end elevational view of the second connector housing 300 of FIG. 1. FIG. 5 illustrates a lateral opening 302a on a first side of the upper central portion 301, a lateral opening 302b on a second side of the upper central portion 301, an inner seal 304 of upper central portion 301, a front cap 306 of the upper central portion 301, a top wall 308 of upper central portion 301, a first terminal pin 402a, and a second terminal pin 402b.

Figure 6:
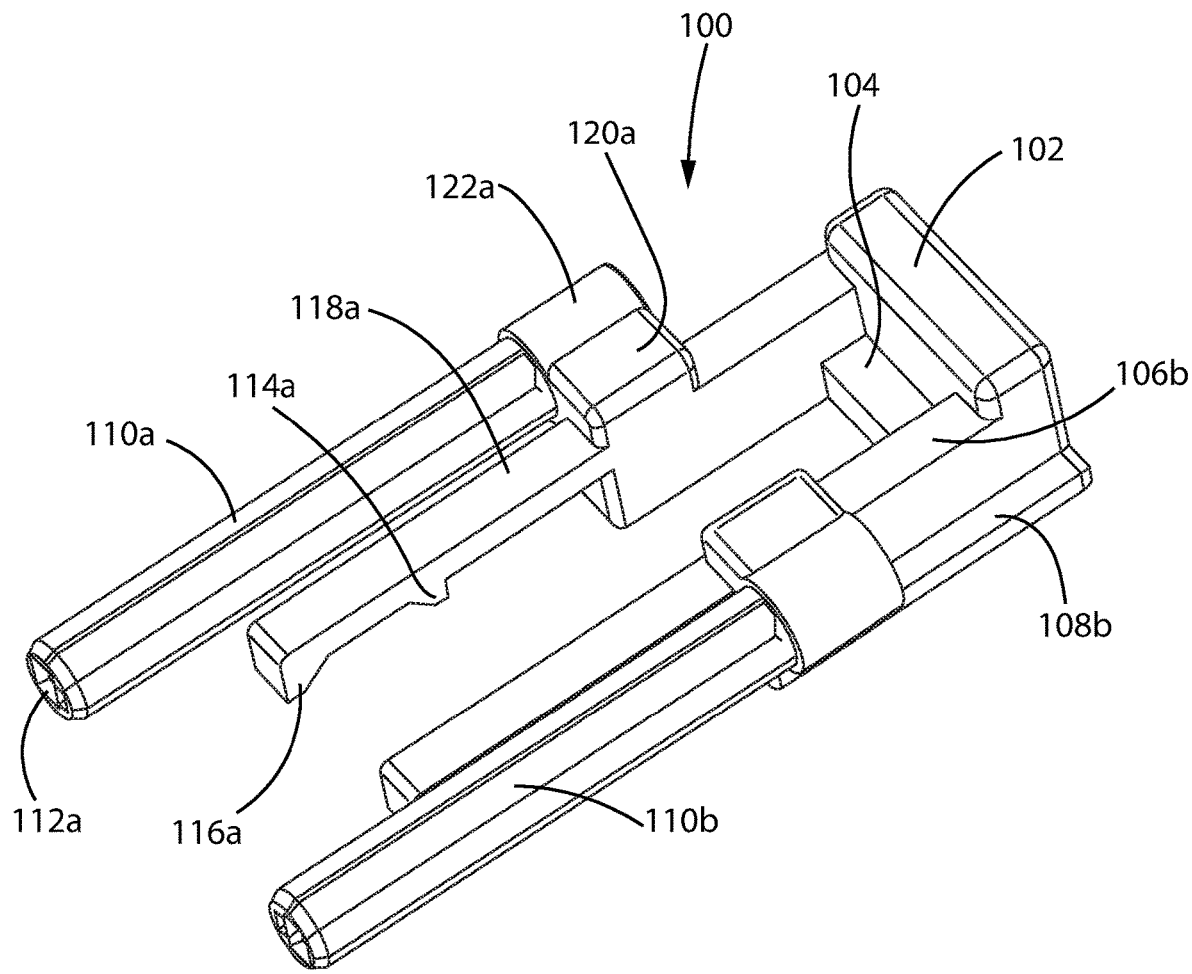
FIG. 6 is a perspective view of the connector position assurance member of FIGURE

FIG. 6 is a perspective view of the connector position assurance member 100 of FIG. 1. FIG. 6 illustrates the connector position assurance (CPA) member 100, which has a rear upper projection 102, a rear lower ledge 104, a first cylindrical terminal member 110a on a first side of the CPA member 100, a front opening 112a of the first cylindrical terminal member 110a, a first flexible member 118a on a first side of the CPA member 100, a first protrusion 114a on the first flexible member 118a, a second protrusion 116a on the first flexible member 118a, a first upper projection 120a on a first side of the CPA member 100, and a rear projection 122a of the first cylindrical terminal member 110a.

Figure 7:
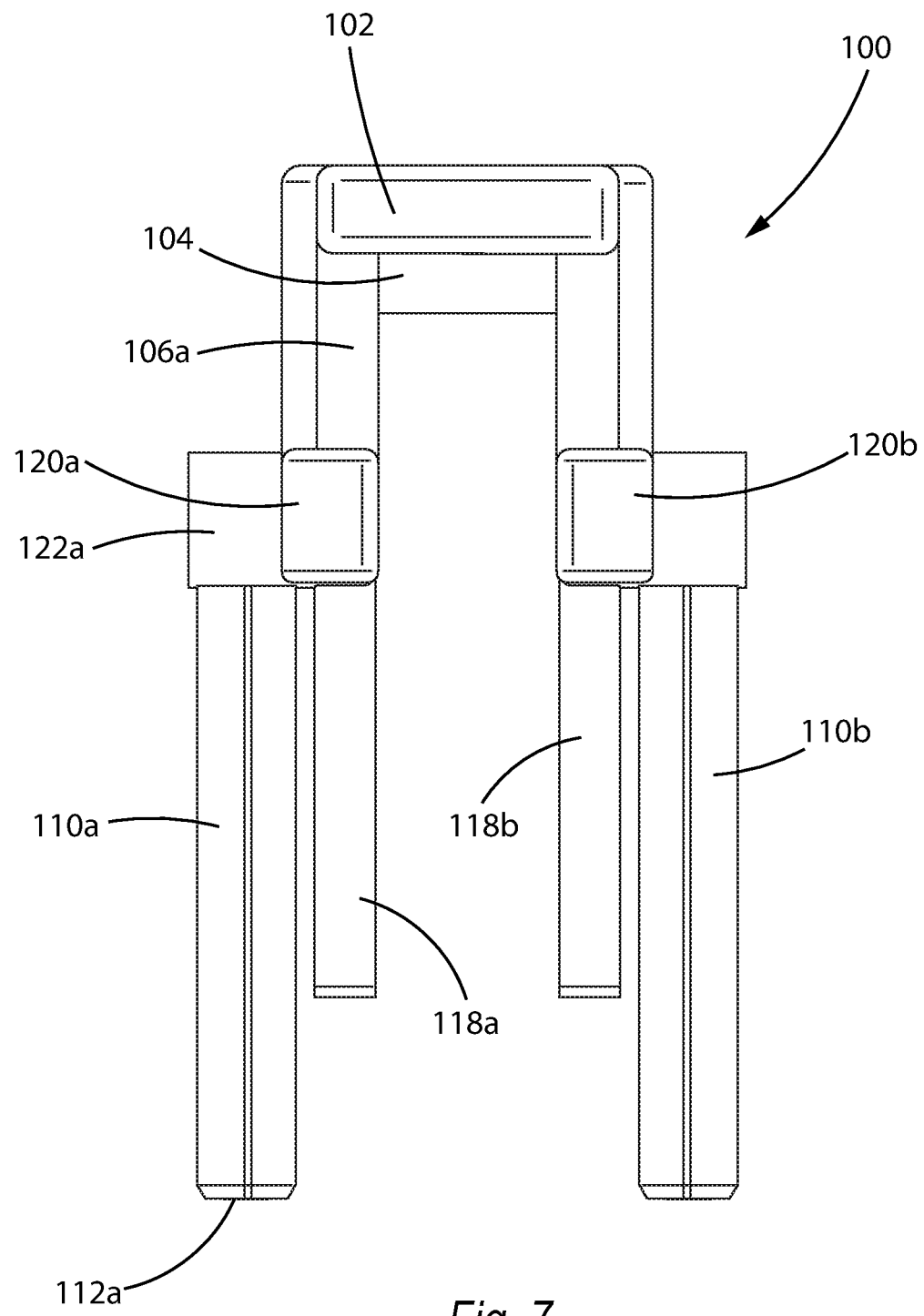
FIG. 7 is a top elevational view of the connector position assurance member of FIG. 1.

FIG. 7 is a top elevational view of the CPA member 100 of FIG. 1. FIG. 7 shows a second cylindrical terminal member 110b, a second flexible member 118b, and a second projection 120b on the second side of the CPA member 100.

The CPA member 100 has two arms 106a, 106b. The first arm 106a is on the first side of the CPA member 100 and includes the first cylindrical terminal member 110a, the front opening 112a of the first cylindrical terminal member 110a, the first flexible member 118a, the first upper projection 120a, and the rear projection 122a (please see FIG. 7). The second arm 106b is on the second side of the CPA member 100 and includes at least a rear side lower ledge 108b and the second cylindrical terminal member 110b (please see FIG. 6).

Figure 8:
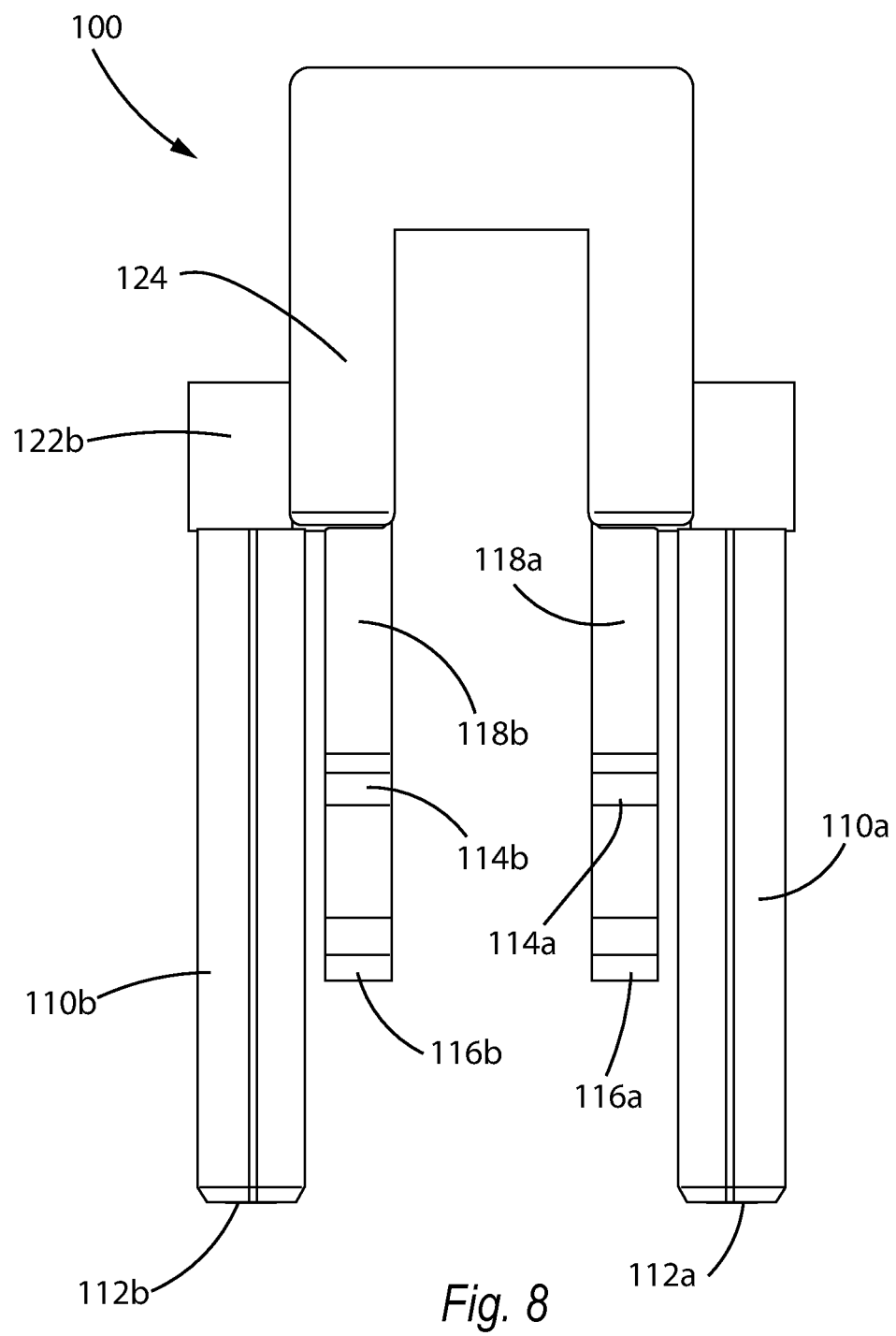
FIG. 8 is a bottom elevational view of the connector position assurance member of FIG. 1.

FIG. 8 is a bottom elevational view of the CPA member 100 of FIG. 1. FIG. 8 illustrates a rear bottom portion 124 of the CPA member 100. The arm 106a on the first side of the CPA member 100 has the first cylindrical terminal member 110a, front opening 112a, first protrusion 114a, second protrusion 116a, and flexible member 118a. The arm 106b on the second side of the CPA member 100 has the second cylindrical terminal member 110b, a front opening 112b, a first protrusion 114b, a second protrusion 116b, the flexible member 118b, and a rear projection 122b of the second cylindrical terminal member 110b.

Figure 9:
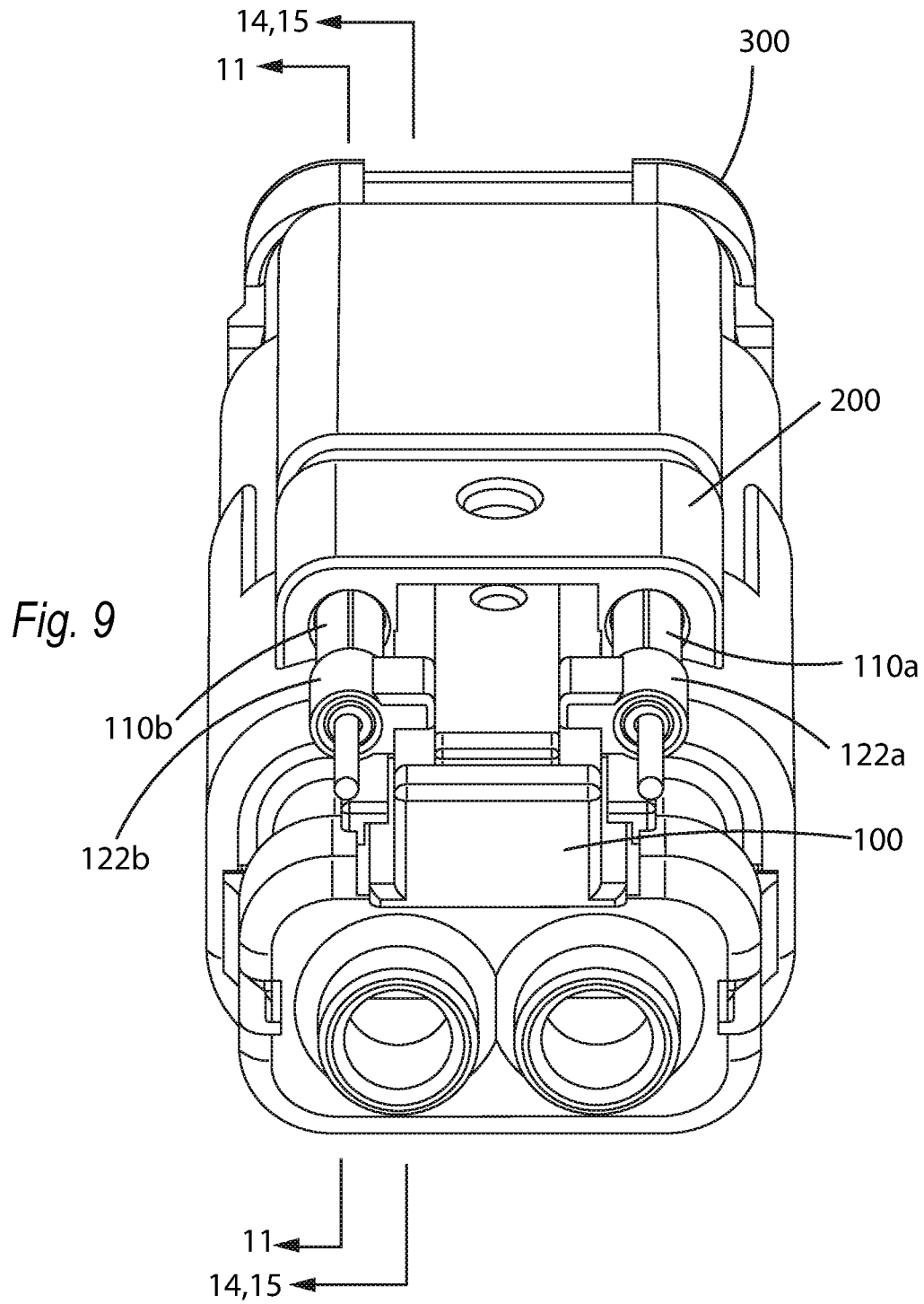
FIG. 9 is a perspective view of the connector system of FIG. 1 assembled with the connector position assurance member in the pre-lock position.

FIG. 9 is a perspective view of the connector system of FIG. 1 assembled with the connector position assurance member 100 in the pre-lock position. FIG. 9 illustrates the CPA member 100 which has the first cylindrical terminal member 110a, the rear projection 122a of the first cylindrical member 110a, the second cylindrical terminal member 110b, and a rear projection 122b of the second cylindrical member 110b. FIG. 9 also illustrates the first connector housing 200 and the second connector housing 300.

Figure 10:
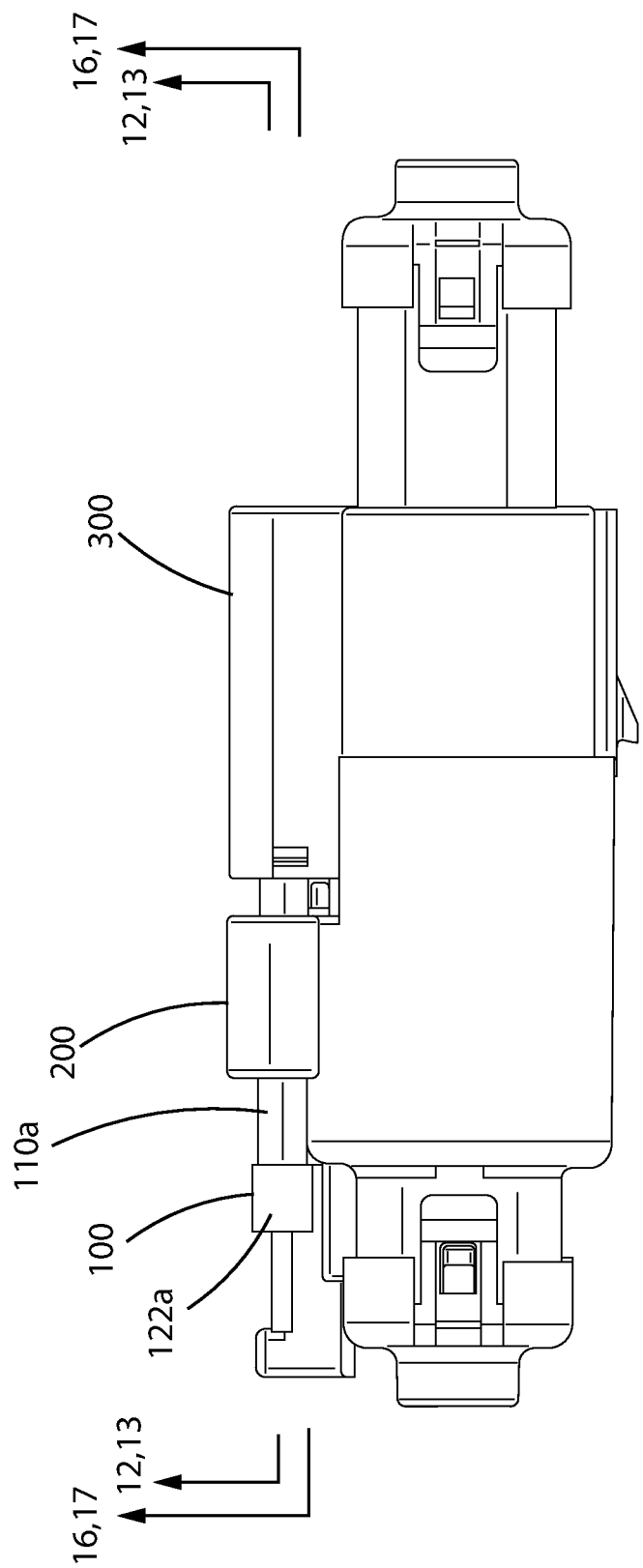
FIG. 10 is a side elevational view of the connector system of FIG. 9.
Figure 11:
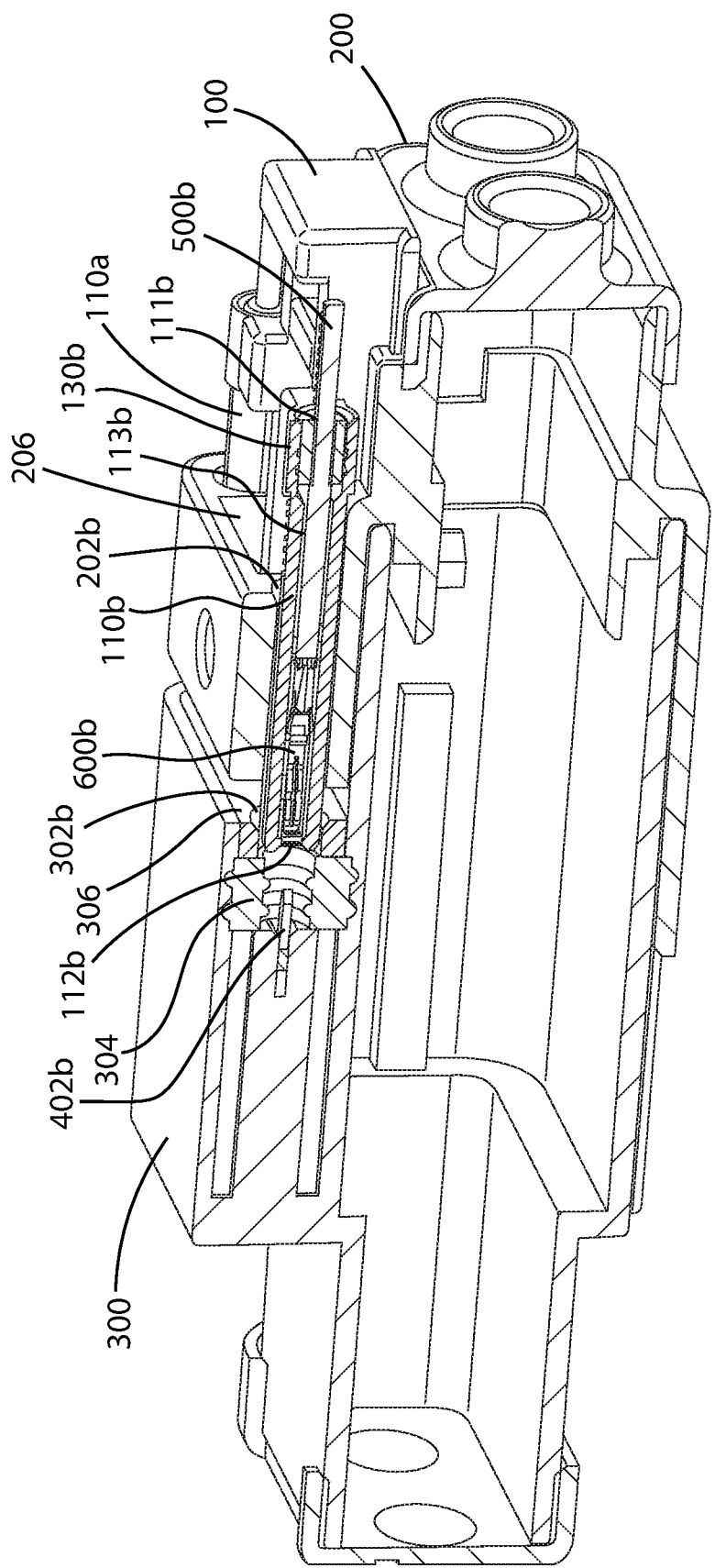
FIG. 11 is a cross-sectional view of the connector system of FIG. 9, taken along the line 11-11.

FIG. 10 is a side elevational view of the connector system of FIG. 9. FIG. 11 is a cross-sectional view of the connector system of FIG. 9, taken along the line 11-11. FIG. 11 illustrates an inner portion 113b of the second cylindrical member 110b, a seal 130b in the second cylindrical member 110b, and a rear opening 111b of the seal 130b. FIG. 11 also illustrates a wire 500b electrically connected to a second terminal socket 600b of the CPA member 100.

Figure 12:
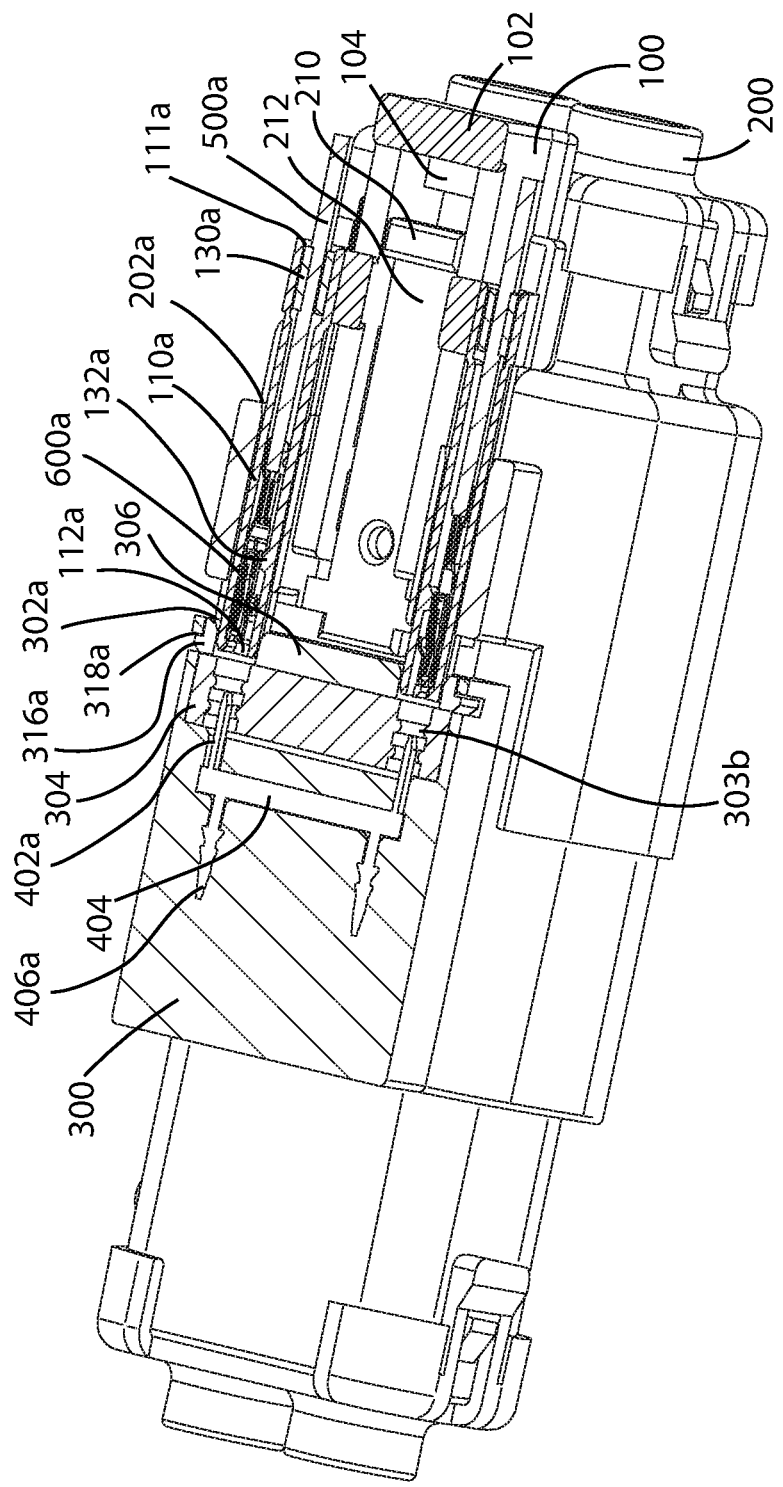
FIG. 12 is a cross-sectional view of the connector system of FIG. 10, taken along the line 12-12.

FIG. 12 is a cross-sectional view of the connector system of FIG. 10, taken along the line 12-12. FIG. 12 illustrates a wire 500a which is connected to a first terminal socket 600a of the CPA member 100. Also shown is a seal 130a in the first cylindrical terminal member 110a. The seal 130a has a rear opening 111a. The first cylindrical terminal member 110a has a protrusion 132a.

The first side of the second connector housing 300 has a lateral side opening 318a. The first side of the second connector housing 300 also has a lateral side protrusion 316a of the front cap 306. The protrusion 316a is received by the lateral side opening 318a to hold such components together. A circuit bridge 404 in the second connector housing 200 electrically connects the first terminal pin 402a with the second terminal pin 402b.

Figure 13:
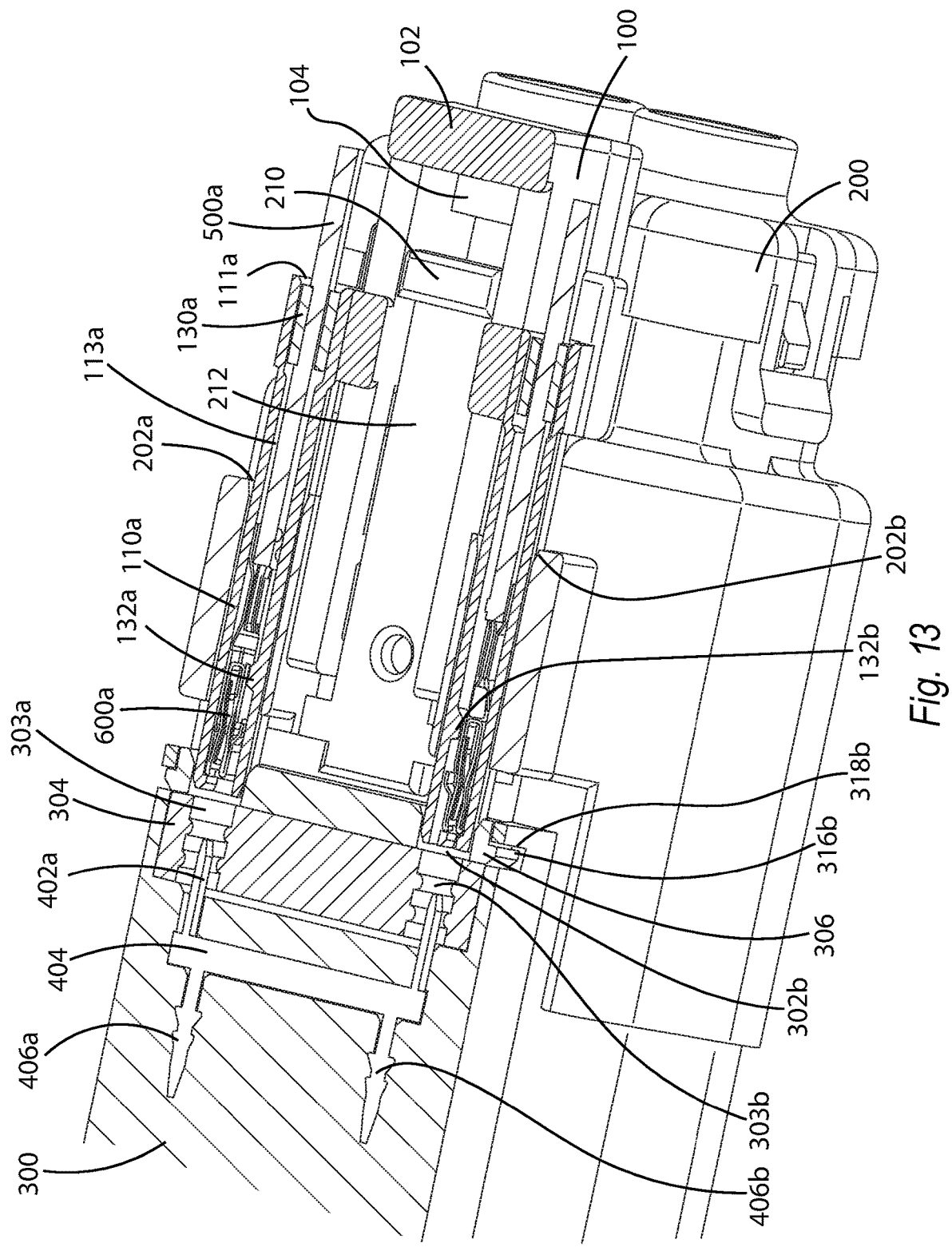
FIG. 13 is a cross-sectional view of the connector system of FIG. 10, taken along the line 13-13.

FIG. 13 is a cross-sectional view of the connector system of FIG. 10, taken along the line 13-13. FIG. 13 illustrates a first terminal pin barb anchor 406a and a second terminal pin barb anchor 406b which help to hold the first terminal pin 402A, the second terminal pin 402B, and the circuit bridge 400 in place in the second connector housing 300. The inner seal 304 has a first inner portion 303a accommodating the first terminal pin 402a and has a second inner portion 303b accommodating the second terminal pin 402b.

The first cylindrical terminal member 110a has an inner portion 113a. The inner portion 113a accommodates the wire 500a, the first terminal socket 600a, and the seal 130a. The second cylindrical terminal member 110b has the inner portion 113b. The inner portion 113b accommodates the wire 500b, the first terminal socket 600b, and the seal 130b. FIG. 13 shows a protrusion 132b in the second cylindrical terminal member 110b.

The second side of the second connector housing 300 has a lateral side opening 318b. The second side of the second connector housing 300 also has a lateral side protrusion 316*b* of the front cap 306. The protrusion 316*b* is received by the lateral side opening 318*b* to hold such components together.

Figure 14:
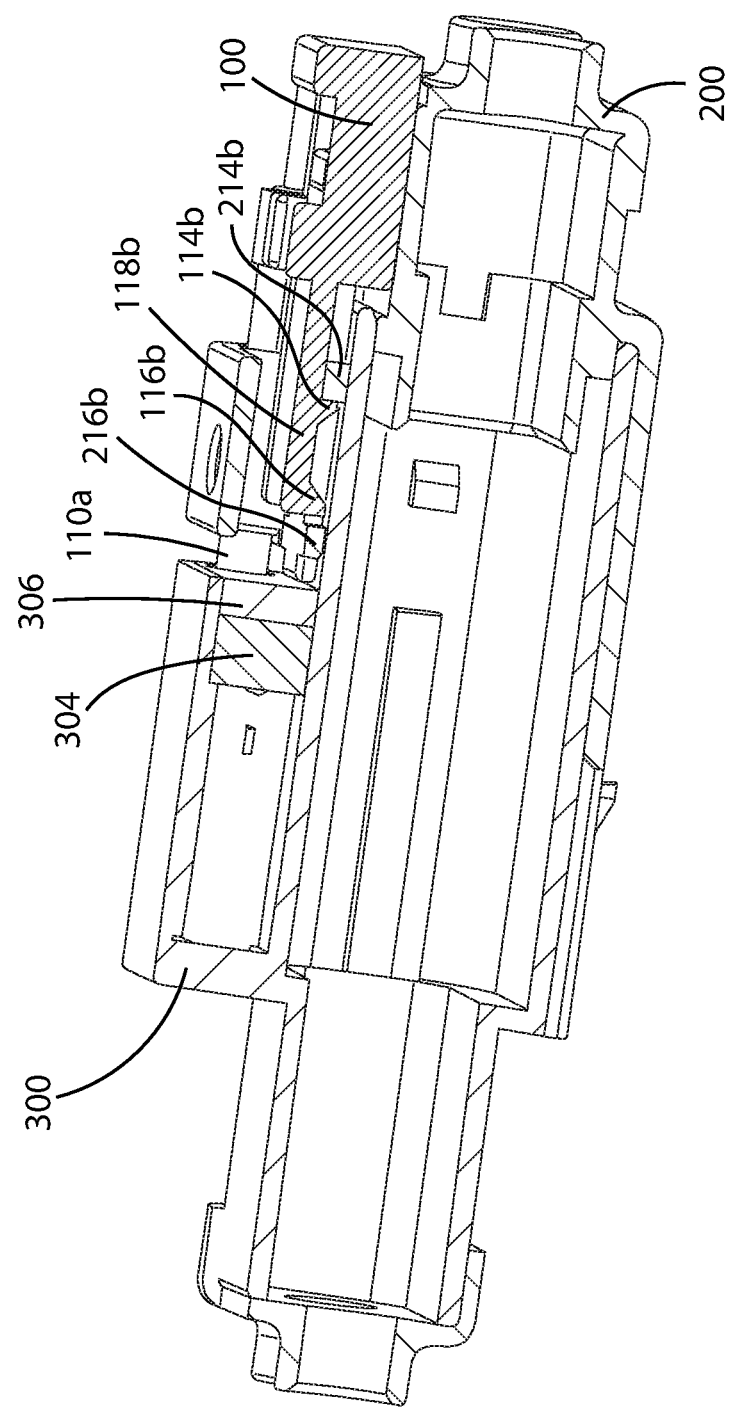
FIG. 14 is a cross-sectional view of the connector system of FIG. 9, taken along the line 14-14.

FIG. 14 is a cross-sectional view of the connector system of FIG. 9, taken along the line 14-14. FIG. 14 illustrates a first central protrusion 214*b* and a second central protrusion 216*b* on the second side of the elongated flexible member 212.

Figure 15:
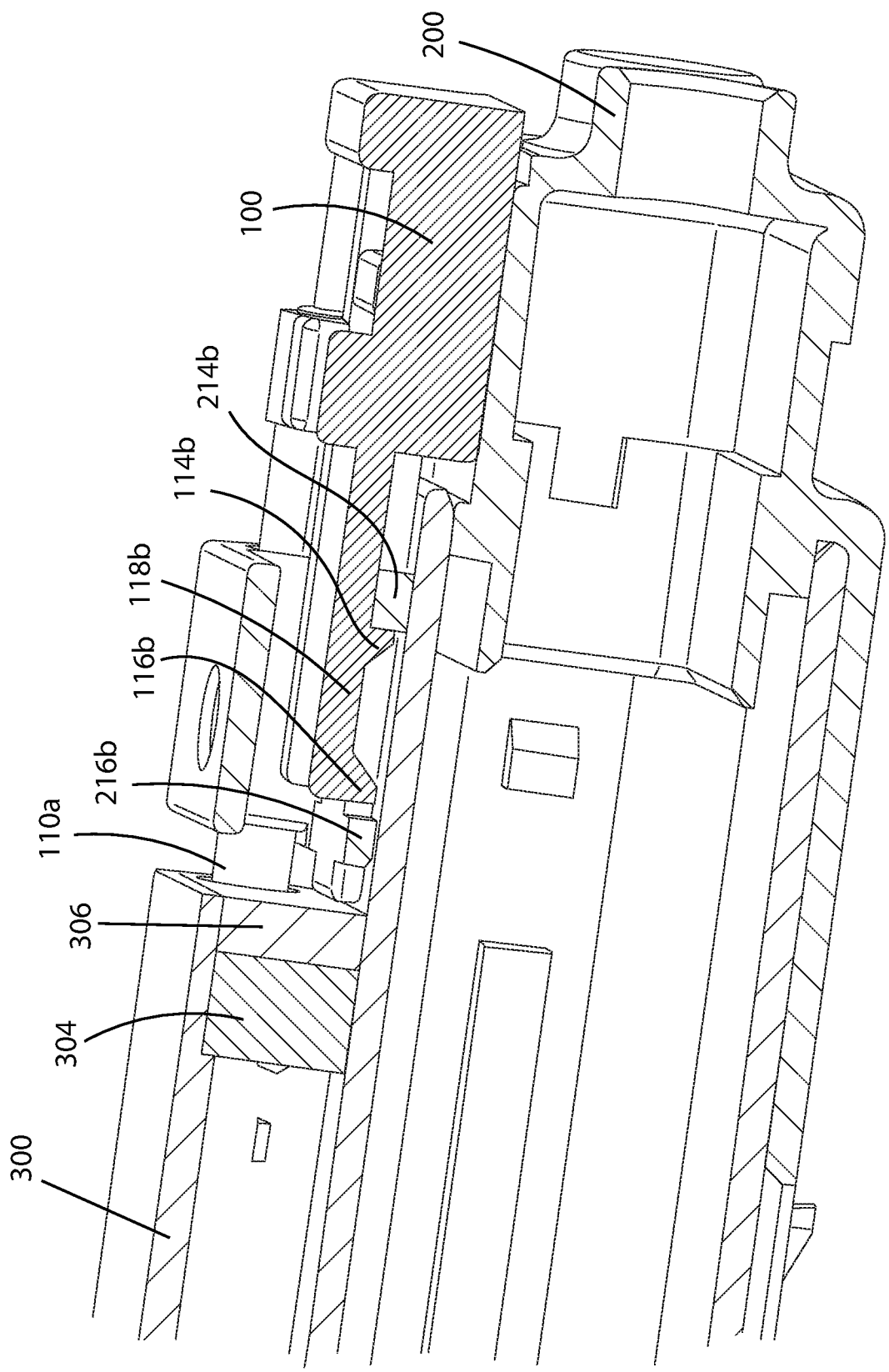
FIG. 15 is a cross-sectional view of the connector system of FIG. 9, taken along the line 15-15.
Figure 16:
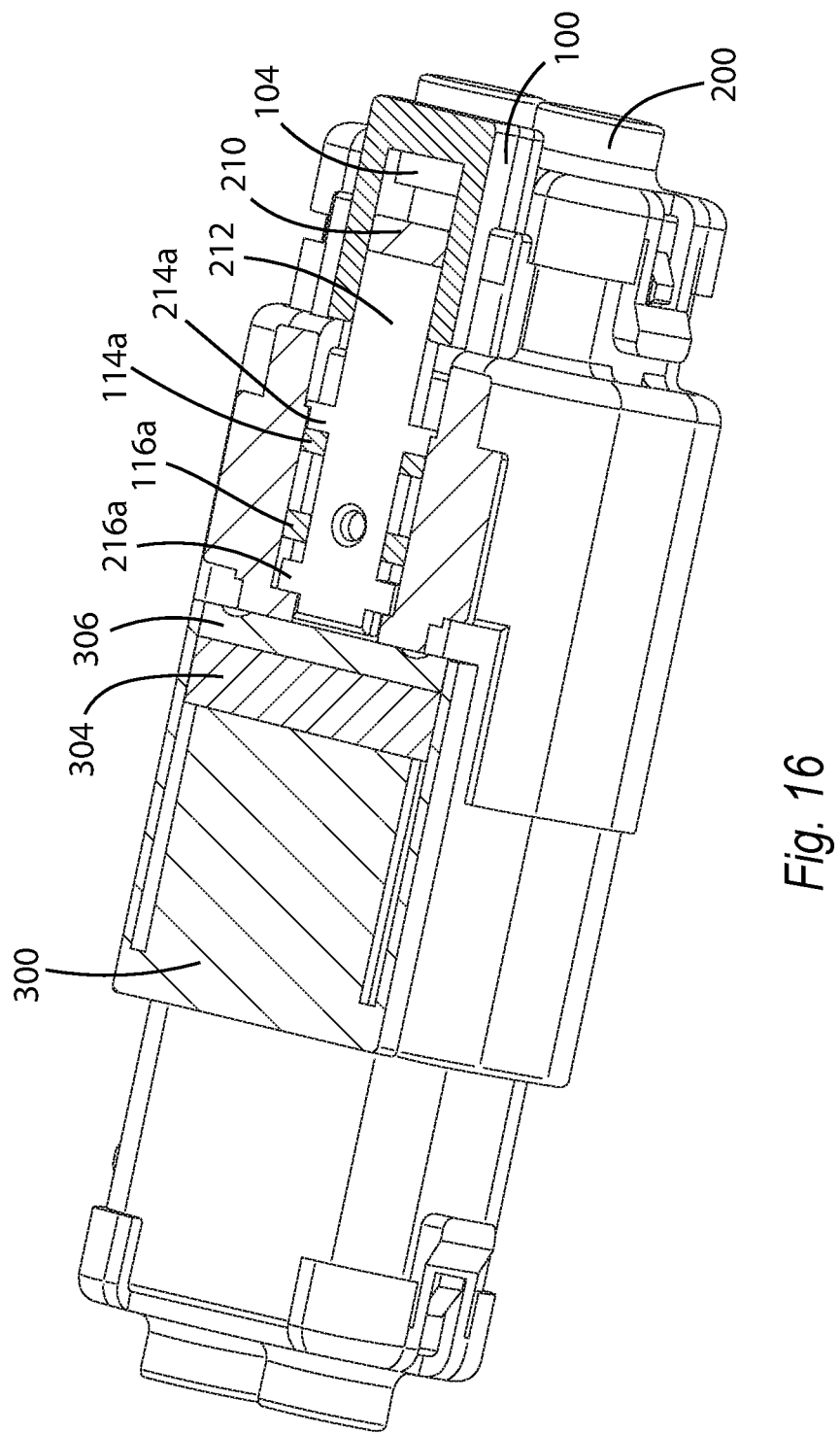
FIG. 16 is a cross-sectional view of the connector system of FIG. 10, taken along the line 16-16.
Figure 17:
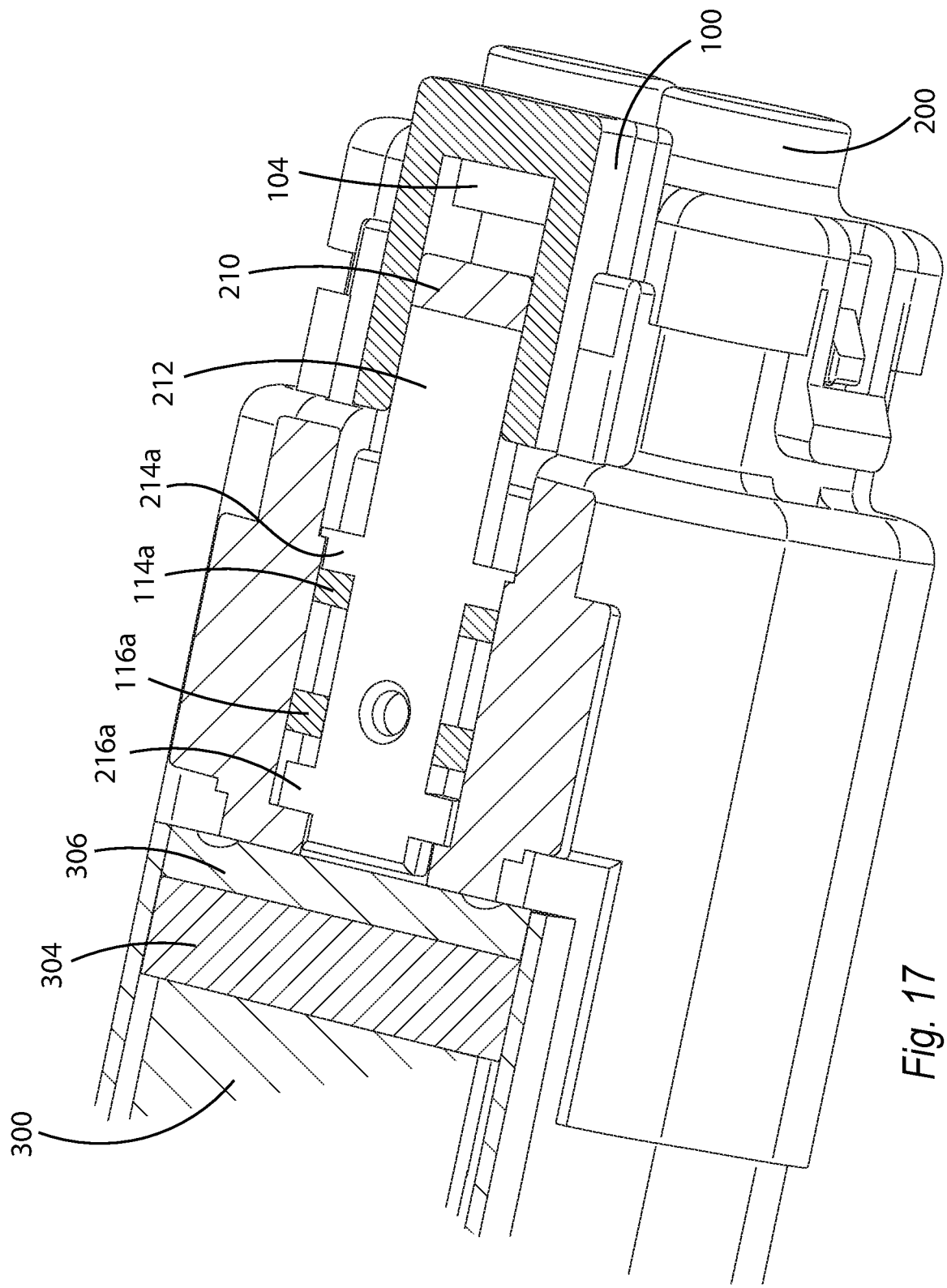
FIG. 17 is a cross-sectional view of the connector system of FIG. 10, taken along the line 17-17.

FIG. 15 is a cross-sectional view of the connector system of FIG. 9, taken along the line 15-15. FIG. 16 is a cross-sectional view of the connector system of FIG. 10, taken along the line 16-16. FIG. 16 illustrates a first central protrusion 214*a* and a second central protrusion 216*a* on the first side of the elongated flexible member 212. FIG. 17 is a cross-sectional view of the connector system of FIG. 10, taken along the line 17-17.

Figure 18:
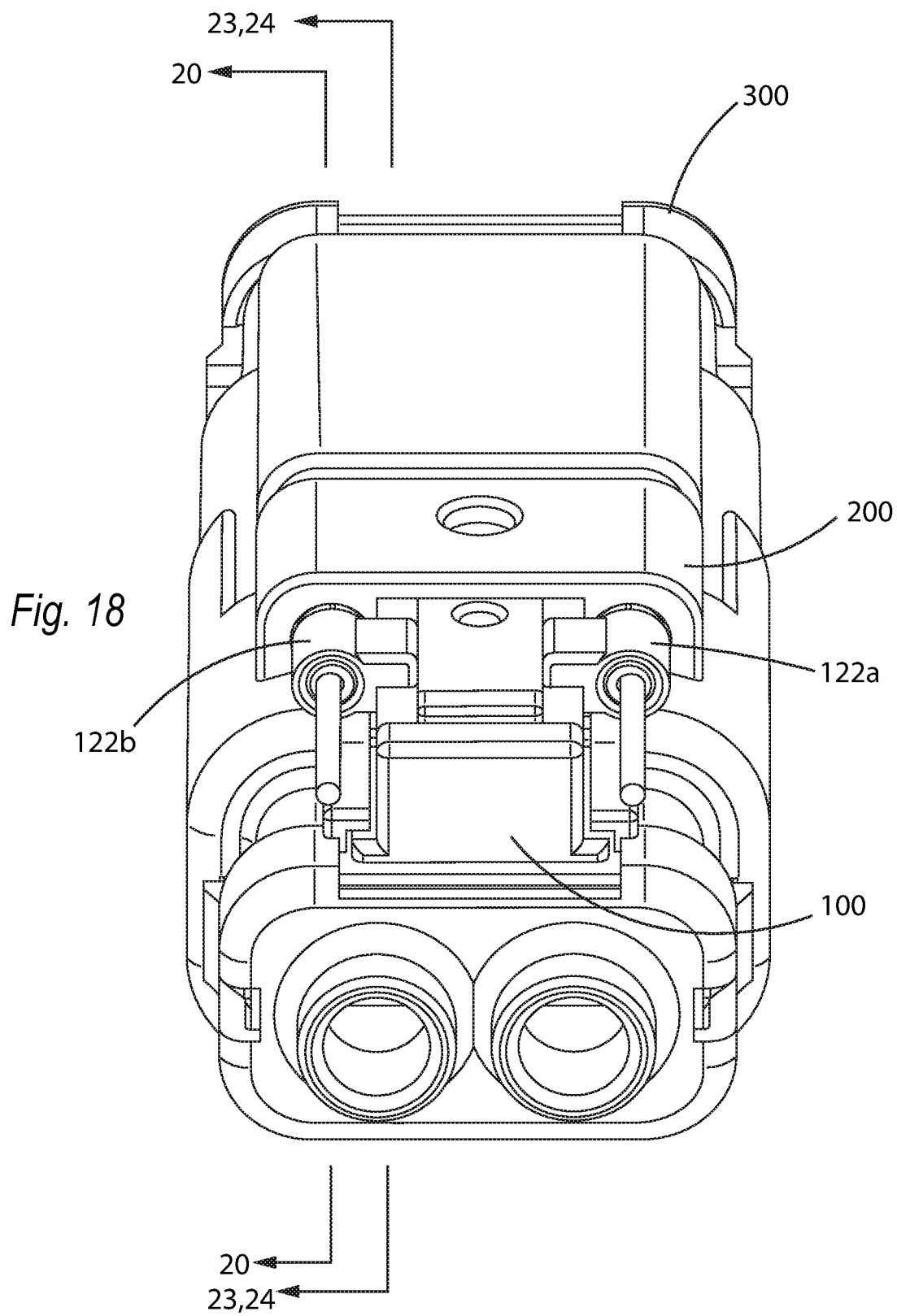
FIG. 18 is a perspective view of the connector system of FIG. 1 assembled with the connector position assurance member in the full-lock position.
Figure 19:
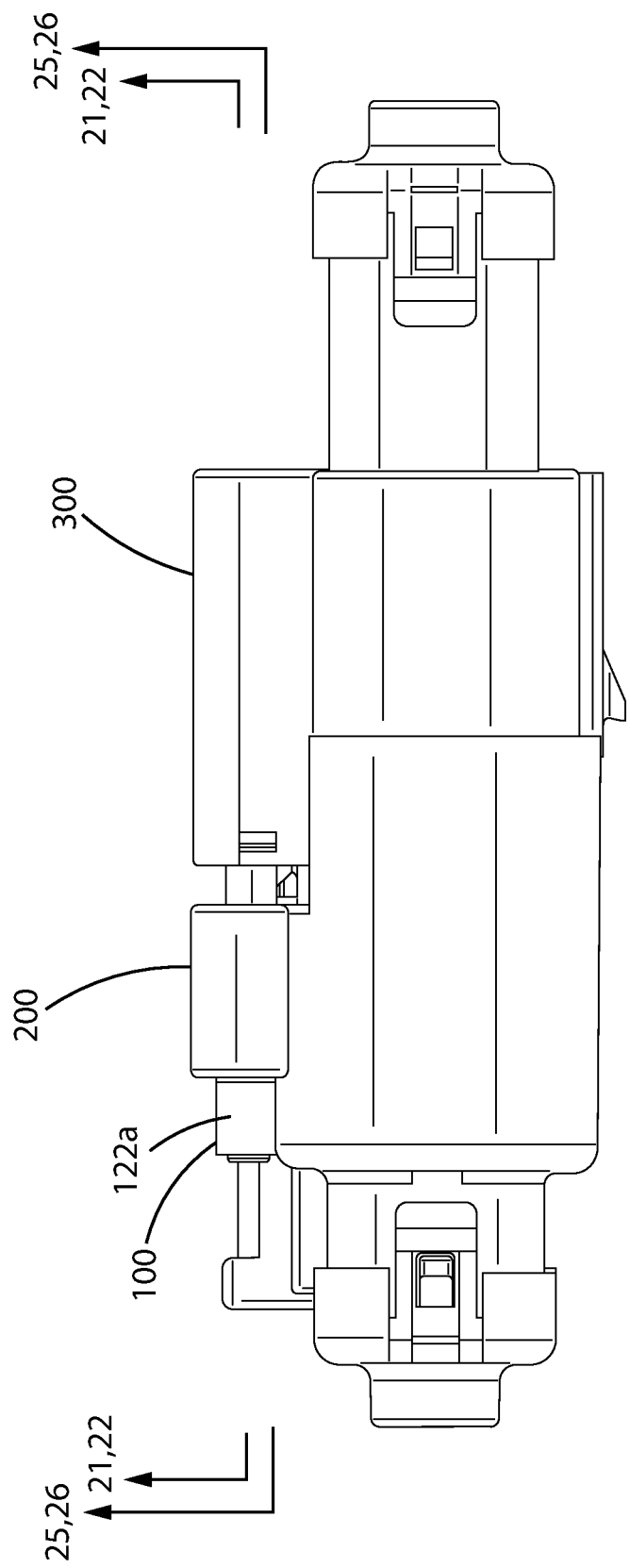
FIG. 19 is a side elevational view of the connector system of FIG. 18.

FIG. 18 is a perspective view of the connector system of FIG. 1 assembled with the connector position assurance member in the full-lock position. FIG. 19 is a side elevational view of the connector system of FIG. 18.

Figure 20:
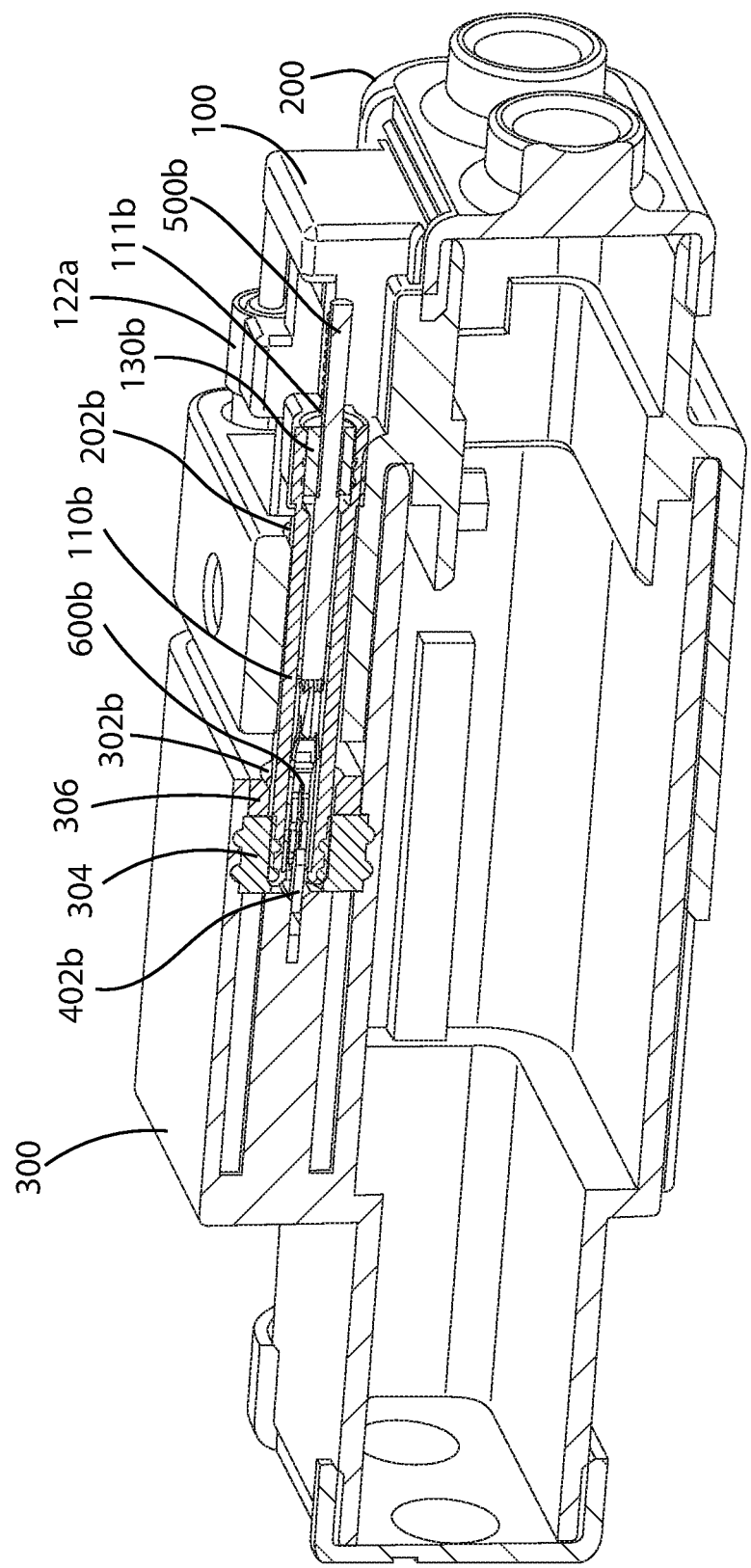
FIG. 20 is a cross-sectional view of the connector system of FIG. 18, taken along the line 20-20.
Figure 21:
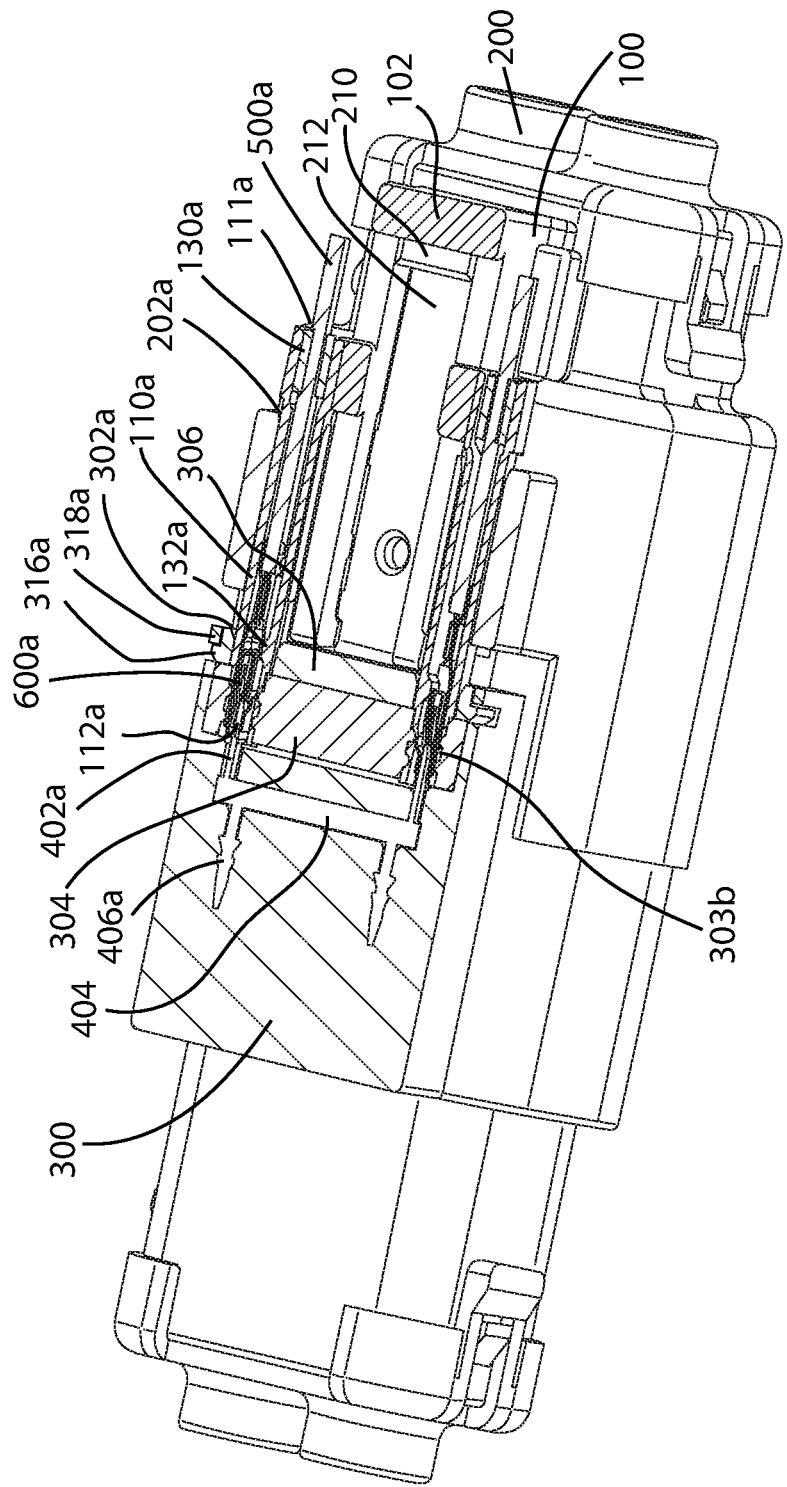
FIG. 21 is a cross-sectional view of the connector system of FIG. 19, taken along the line 21-21.
Figure 22:
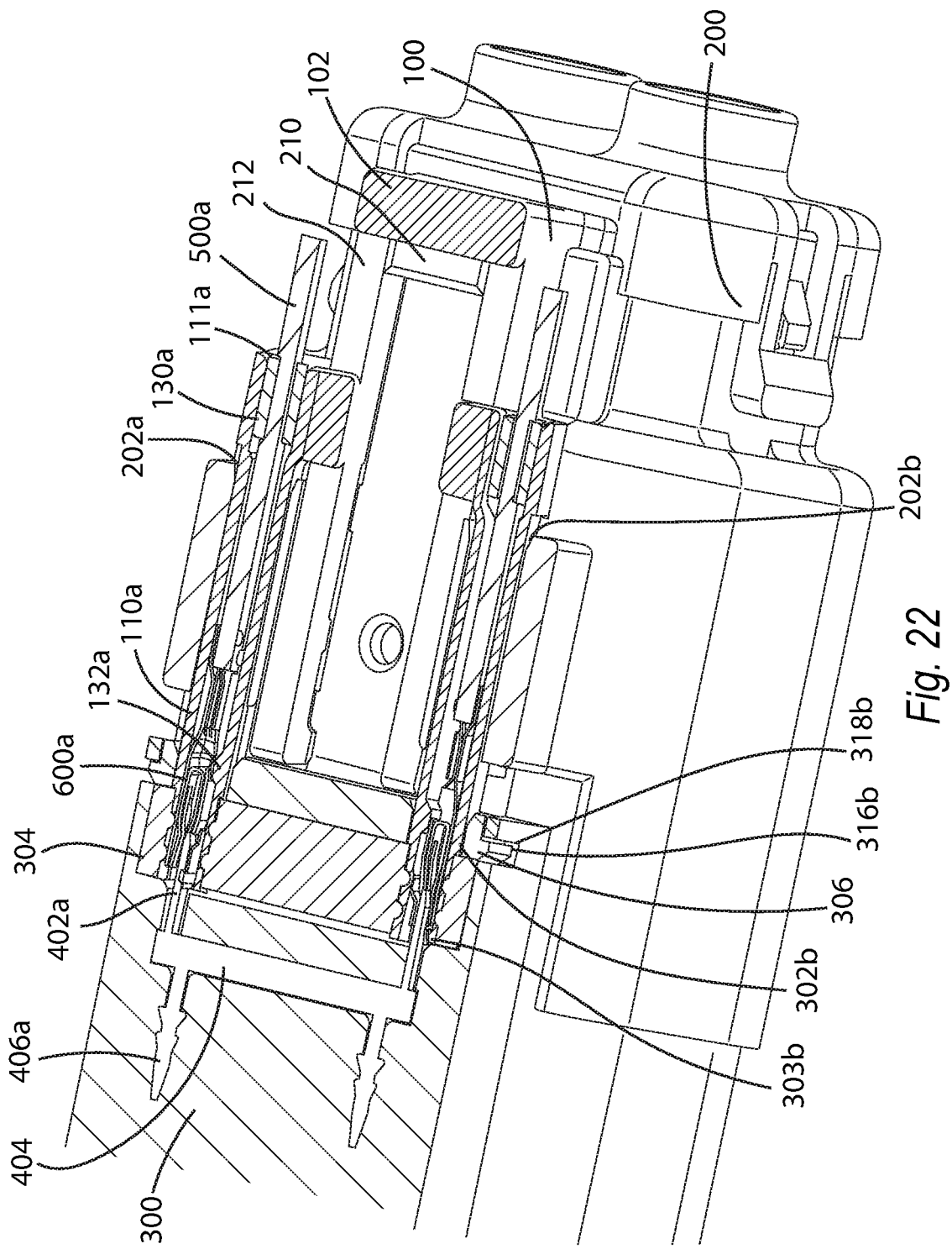
FIG. 22 is a cross-sectional view of the connector system of FIG. 19, taken along the line 22-22.
Figure 23:
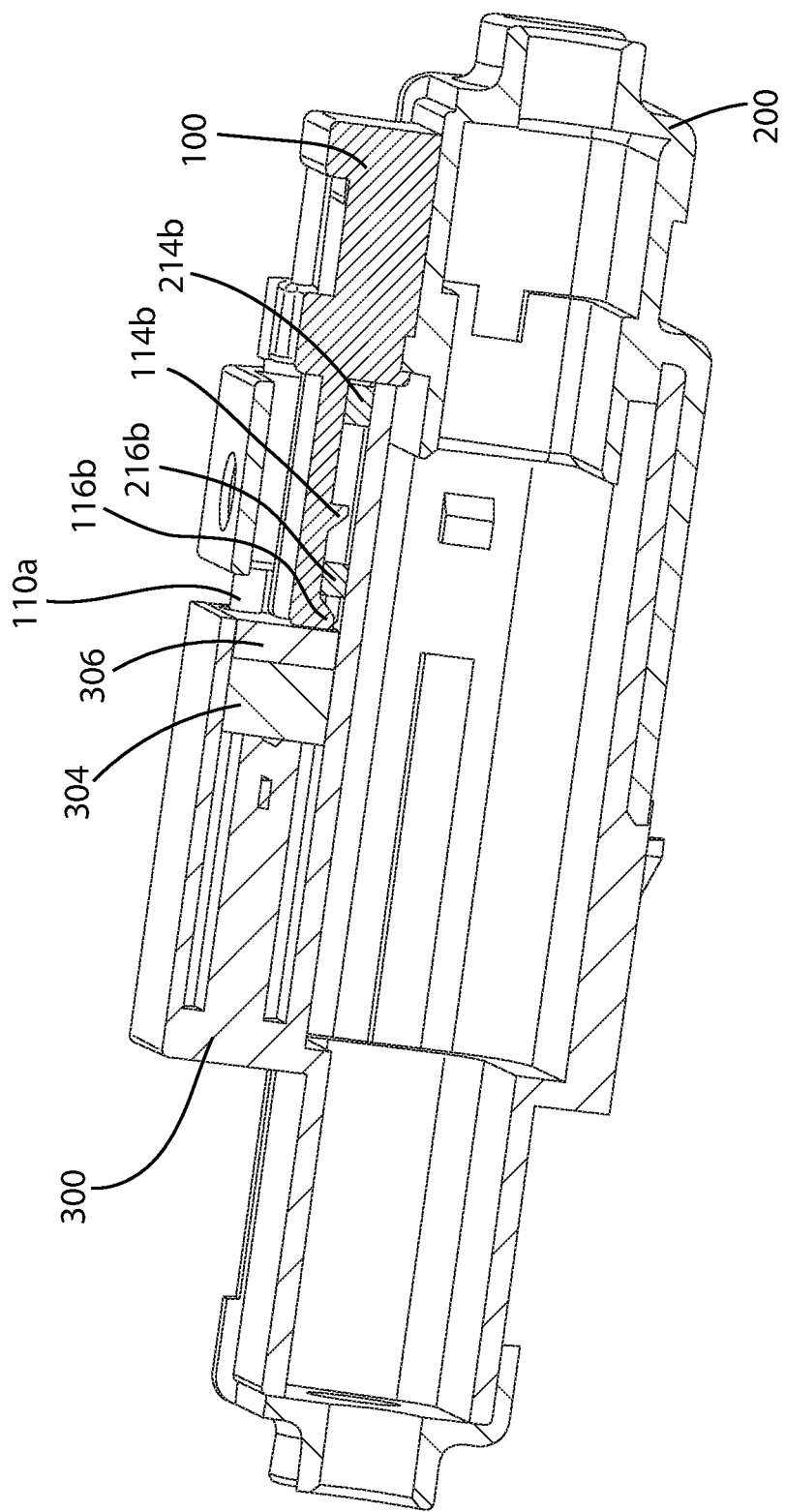
FIG. 23 is a cross-sectional view of the connector system of FIG. 18, taken along the line 23-23.

FIG. 20 is a cross-sectional view of the connector system of FIG. 18, taken along the line 20-20. FIG. 21 is a cross-sectional view of the connector system of FIG. 19, taken along the line 21-21. FIG. 22 is a cross-sectional view of the connector system of FIG. 19, taken along the line 22-22. FIG. 23 is a cross-sectional view of the connector system of FIG. 18, taken along the line 23-23.

Figure 24:
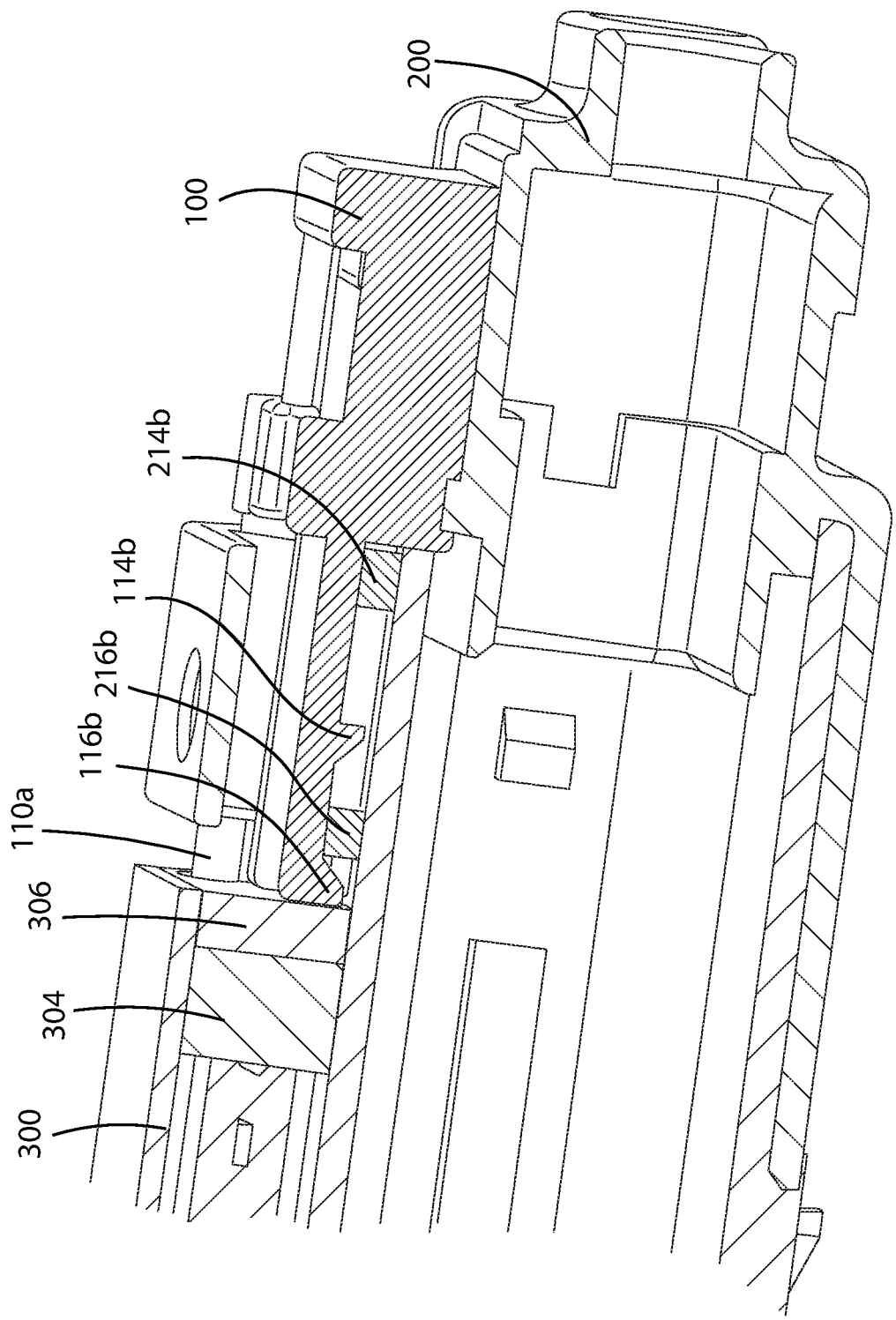
FIG. 24 is a cross-sectional view of the connector system of FIG. 18, taken along the line 24-24.
Figure 25:
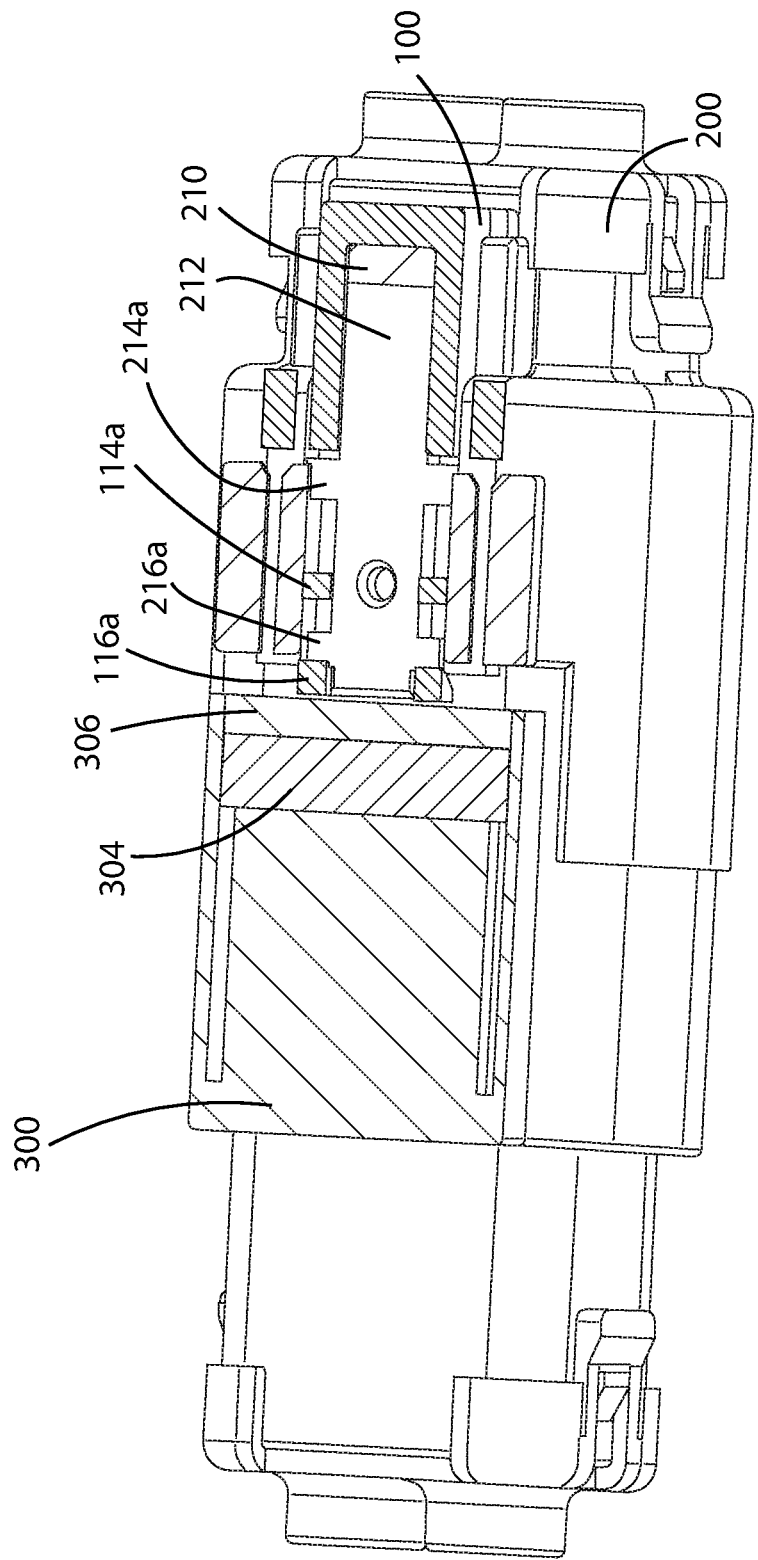
FIG. 25 is a cross-sectional view of the connector system of FIG. 19, taken along the line 25-25.
Figure 26:
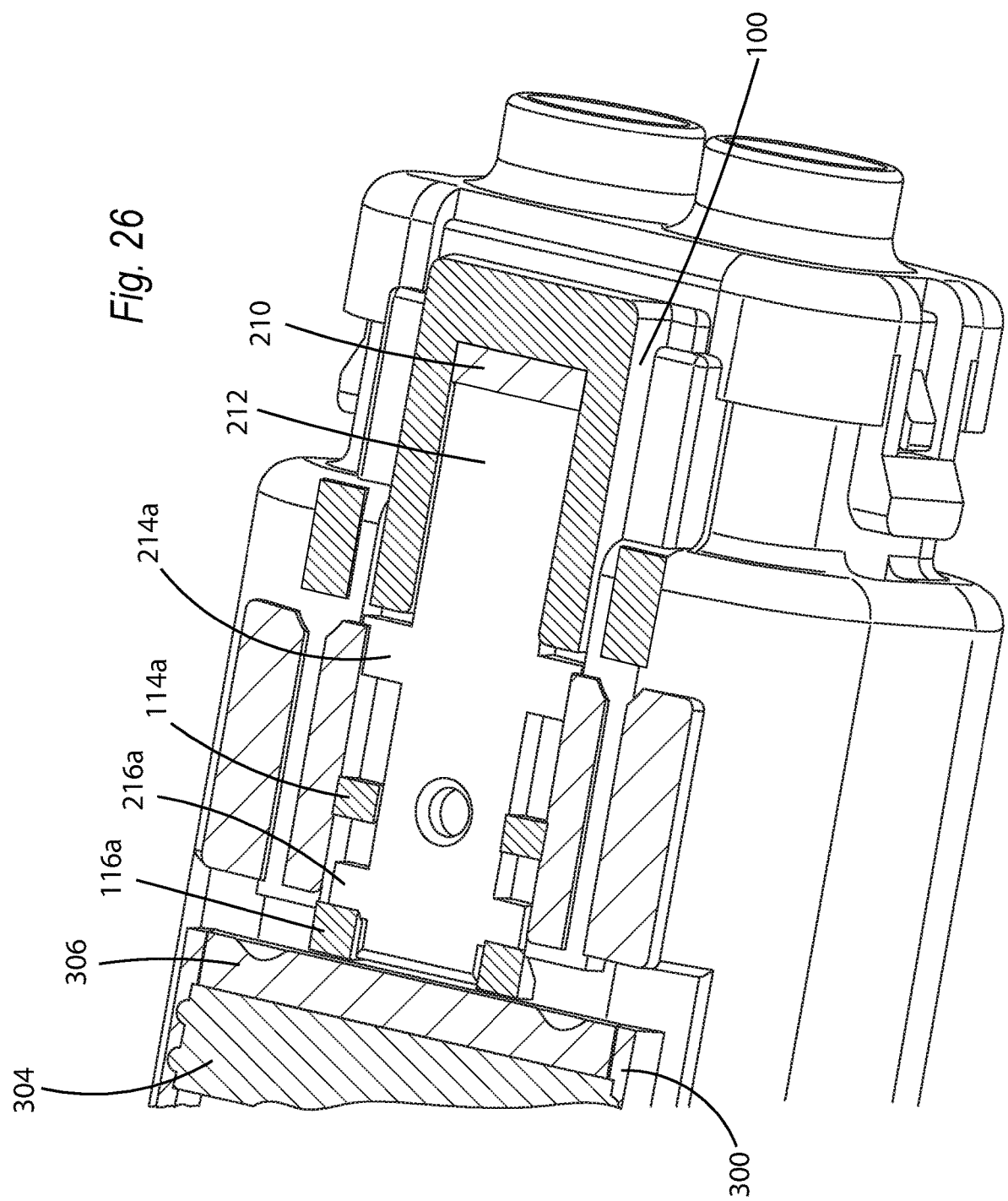
FIG. 26 is a cross-sectional view of the connector system of FIG. 19, taken along the line 26-26.
Figure 27:
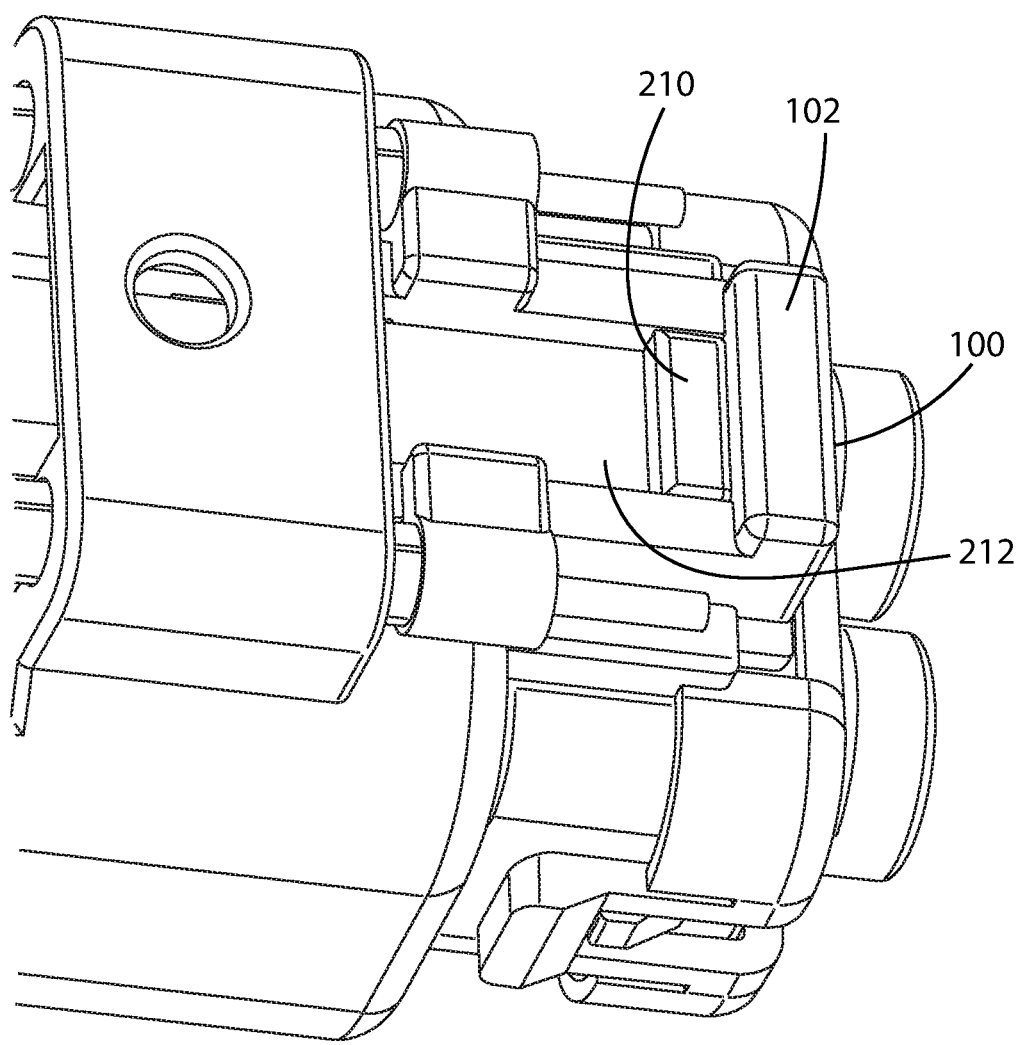
FIG. 27 is a perspective view of a portion of the connector system of FIG. 1 assembled with the connector position assurance member in the full-lock position.

FIG. 24 is a cross-sectional view of the connector system of FIG. 18, taken along the line 24-24. FIG. 25 is a cross-sectional view of the connector system of FIG. 19, taken along the line 25-25. FIG. 26 is a cross-sectional view of the connector system of FIG. 19, taken along the line 26-26. FIG. 27 is a perspective view of a portion of the connector system of FIG. 1 assembled with the connector position assurance member in the full-lock position.

The seals 130*a*, 130*b*, and 304 serve to help prevent water and other liquids and substances from coming into contact with the components protected by the seals. The seals protect at least the terminal pins 402*a*, 402*b* and the terminal sockets 600*a*, 600*b*.

In order to insert the CPA member 100 into the first connector housing 200 and thereby place the CPA member 100 into the pre-lock position, the first cylindrical terminal member 110*a* must be inserted into the lateral opening 202*a* of the first connector housing 200 while the second cylindrical terminal member 110*b* is inserted into the lateral opening 202*b* of the first connector housing 200.

After the first cylindrical terminal member 110*a* has penetrated the lateral opening 202*a* of the first connector housing 200, the first cylindrical terminal member 110*a* must also penetrate the lateral opening 302*a* of the second connector housing 300. After the second cylindrical terminal member 110*b* has penetrated the lateral opening 202*b* of the first connector housing 200, the second cylindrical terminal member 110*b* must also penetrate the lateral opening 302*b* of the second connector housing 300.

The first cylindrical terminal member 110*a* must also be inserted into the lateral opening 302*a* of the second connector housing 300 while the second cylindrical terminal member 110*b* is inserted into the lateral opening 302*b* of the second connector housing 300.

The pre-lock position of the CPA member 100 is shown in FIGS. 9-17. The first and second connector housings 200 and 300 fit together as shown in FIGS. 9-27 (see also FIG. 1). As shown in FIG. 11, the second terminal socket 600*b* of the CPA member 100 is not in electrical contact with the second terminal pin 402*b* of the second connector housing 300. In particular, the front opening 112*b* is spaced apart from the second terminal pin 402*b*.

As shown in FIG. 12, the first terminal socket 600*a* of the CPA member 100 is not in electrical contact with the first terminal pin 402*a* of the second connector housing 300. In particular, the front opening 112*a* is spaced apart from the first terminal pin 402*a*. In the pre-lock position, there is an open circuit condition and thus electricity cannot flow between wire 500*b* and wire 500*a*, because the first terminal socket 600*a* is not electrically connected with the first terminal pin 402*a* and the second terminal socket 600*b* is not electrically connected with the second terminal pin 402*b*.

As shown in FIGS. 14-17, the CPA member 100 has been pushed a first distance into the first connector housing 200 mated with the second connector housing 300, such that the first protrusion 114*b* has moved past the first central protrusion 214*b*, the second protrusion 116*b* has moved past the first central protrusion 214*b*, and the second protrusion 116*b* has not moved past the second central protrusion 216*b*. That first distance corresponds to the pre-lock position. The first protrusion 114*b* and the second protrusion 116*b* are able to move past the first central protrusion 214*b* because the second member 118*b* is flexible.

In the pre-lock position, as shown in FIG. 15, the first cylindrical terminal member 110*a* has been inserted through lateral opening 202*a* of the first connector housing 200 and has also been partially inserted into the front cap 306 of the second connector housing 300. Thus, in the pre-lock position, the CPA member 100 is engaged with both the first connector housing 200 and the second connector housing 300.

As shown in FIGS. 14-17, the first central protrusion 214*b* helps to hold the CPA member 100 in the correct pre-lock position and prevents the CPA member 100 from moving backwards out from the first and second connector housings 200, 300. As shown in FIGS. 14-17, the second central protrusion 216*b* helps to hold the CPA member 100 in the correct pre-lock position and prevents the CPA member 100 from inadvertently moving to the full-lock position.

As shown in FIGS. 14-17, the first protrusion 114*a* has moved past the first central protrusion 214*a*, the second protrusion 116*a* has moved past the first central protrusion 114*a*, the first central protrusion 214*a* has not moved past the second central protrusion 216*a*, and the second protrusion 116*a* has not moved past the second central protrusion 216*a*. The first central protrusion 214*a* helps to hold the CPA member 100 in the correct pre-lock position and prevents the CPA member 100 from moving backwards out from the first and second connector housings 200, 300. The second central protrusion 216*a* helps to hold the CPA member 100 in the correct pre-lock position and prevents the CPA member 100 from inadvertently moving to the full-lock position. The first protrusion 114*a* and the second protrusion 116*a* are able to move past the first central protrusion 214*a* because the first member 118*a* is flexible.

As shown in FIG. 17, for the pre-lock position, the rear upper projection 210 of the first connector housing 200 is not directly over the rear lower ledge 104 of the CPA member 100. Thus, for the pre-lock position, the rear upper projection 210 of the first connector housing 200 is not blocking upward movement of the rear lower ledge 104 of the CPA member 100. When the CPA member 100 is in the pre-lock position, it is possible to move the rear upper projection 102 upward (please see FIG. 10).

The full-lock position of the CPA member 100 is shown in FIGS. 18-27. As shown in FIG. 20, the second terminal socket 600*b* of the CPA member 100 is in electrical contact with the second terminal pin 402b of the second connector housing 300. In particular, the front opening 112b is being penetrated by the second terminal pin 402b.

As shown in FIG. 22, the first terminal socket 600a of the CPA member 100 is in electrical contact with the first terminal pin 402a of the second connector housing 300. In particular, the front opening 112a is being penetrated by the first terminal pin 402a.

In the full-lock position, there is a closed circuit condition and thus electricity can flow through and between wire 500b and wire 500a, because the first terminal socket 600a is electrically connected with the first terminal pin 402a while the second terminal socket 600b is also electrically connected with the second terminal pin 402b.

As shown in FIG. 23, the CPA member 100 has been pushed into the first connector housing 200 and second connector housing 300 by a second distance, such that the second protrusion 116b has moved past the second central protrusion 216b. That second distance corresponds to the full-lock position. The second central protrusion 216b helps to hold the CPA member 100 in the correct full-lock position and prevents the CPA member 100 from coming out from the first and second connector housings 200, 300.

In the full-lock position, the second protrusion 116a has moved deeper into the second connector housing 300 and has moved past the second central protrusion 216a. As shown in FIG. 25, the first protrusion 114a has moved past the first central protrusion 214a but has not moved past the second central protrusion 216a. The second central protrusion 216a helps to hold the CPA member 100 in the correct full-lock position and prevents the CPA member 100 from coming out from the first and second connector housings 200, 300.

As shown in FIGS. 25-27, for the full-lock position, the rear upper projection 210 of the first connector housing 200 is directly over the rear lower ledge 104 of the CPA member 100. Thus, for the full-lock position, the rear upper projection 210 of the first connector housing 200 is blocking upward movement of the rear lower ledge 104 of the CPA member 100. When the CPA member 100 is in the full-lock position, it is not possible to move the rear upper projection 102 upward (please see FIGS. 20 and 21).

The connector system of the present invention helps the CPA member 100 to stay in the pre-lock position during shipping and handling.

The connector system of the present invention helps to prevent a need for a user to engage in a secondary operation such as trying to move a different CPA member from a full-lock position to a pre-lock position, for example, after that different CPA member was inadvertently moved into the full-lock position during shipping and handling.

The CPA member 100 of the present invention includes components of an electrical circuit at least in a first arm 106a of the CPA member 100 and in a second arm 106b of the CPA member 100. The first arm 106a has at least the terminal socket 600a and wire 500a. The second arm 106b has at least the terminal socket 600b and wire 500b. The second connector housing 300 has at least terminal pins 402a, 402b connected to each other by the circuit bridge 404.

When the CPA member 100 is in the pre-lock position, there is an open electrical circuit because the first terminal member 110a is not connected electrically with the second terminal member 110b through the second connector housing 300. When the CPA member 100 is in the full-lock position, there is a closed electrical circuit because the first terminal member 110a is connected electrically with the second terminal member 110b through electrically conductive components located in the second connector housing 300.

An electronic measuring instrument, such as a multimeter or multitester or other device, can be connected to the wire 500a and the wire 500b and be used to detect whether the electrical circuit is open or closed. When the electrical circuit is detected as being a closed circuit, this provides additional assurance that the first connector housing 200 is fully engaged with the second connector housing 300 and also that the CPA member 100 is in the full-lock position.

The connector system of the present invention can be operated by: (1) mating CPA member 100 with the first connector housing 200 or inserting CPA member 100 into the first connector housing 200 a first distance corresponding to the pre-lock position, (2) coupling the first connector housing 200 with the second connector housing 300, (3) detecting an open electrical circuit condition by using an electronic measuring instrument connected to wires 500a, 500b, (4) moving the CPA member 100 into the second connector housing 300 a second distance corresponding to the full-lock position, and (5) detecting a closed electrical circuit condition by using an electronic measuring instrument connected to wires 500a, 500b.

The CPA member 100 can be referred to as a CPA device 100 or CPA unit 100. The first flexible member 118a can be referred to as a first flexible unit 118a. The second flexible member 118b can be referred to as a second flexible unit 118b. The protrusions 114a, 114b, 116a, 116b on the CPA member 100 can be referred to as CPA protrusions 114a, 114b, 116a, 116b. The protrusions 214a, 214b, 216a, 216b on the elongated flexible member 212 of the first connector housing 200, as shown in FIG. 16, can be referred to as housing protrusions 214a, 214b, 216a, 216b.

A second embodiment of the present invention includes a CPA member that has two terminal pins instead of the two terminal sockets 600a, 600b, and includes a second connector housing that has two terminal sockets instead of the two terminal pins 402a, 402b. In the second embodiment, the two terminal sockets are electrically connected to the circuit bridge 404.

A third embodiment of the present invention has only one flexible member instead of the two flexible members 118a, 118b, wherein the one flexible member is located either where the first flexible member 118a is located or where the second flexible member 118b is located.

Although the foregoing description is directed to the preferred embodiments of the invention, it is noted that other variations and modifications will be apparent to those skilled in the art, and may be made without departing from the spirit or scope of the invention. Moreover, features described in connection with one embodiment of the invention may be used in conjunction with other embodiments, even if not explicitly stated above.

LIST OF REFERENCE NUMERALS

100 Connector position assurance (CPA) member
102 Rear upper projection of the CPA member 100
104 Rear lower ledge of the CPA member 100
106a First arm of the CPA member 100
106b Second arm of the CPA member 100
108 Rear side lower ledge of arm of the CPA member 100
110a First cylindrical terminal member on a first side of the CPA member 100
110b Second cylindrical terminal member on the CPA member 100

111a Rear opening of seal in first cylindrical terminal member of the CPA member 100
111b Rear opening of seal in second cylindrical terminal member of the CPA member 100
112a Front opening in first cylindrical terminal member of the CPA member 100
112b Front opening in second cylindrical terminal member of the CPA member 100
113a Inner portion of first cylindrical terminal member of the CPA member 100
113b Inner portion of second cylindrical terminal member of the CPA member 100
114a First protrusion on first flexible member of the CPA member 100
114b First protrusion on second flexible member of the CPA member 100
116a Second protrusion on first flexible member of the CPA member 100
116b Second protrusion on second flexible member of the CPA member 100
118a First flexible member of the CPA member 100
118b Second flexible member of the CPA member 100
120a First upper projection of the CPA member 100
120b Second projection of arm of the CPA member 100
122a Rear projection of first cylindrical terminal member of the CPA member 100
122b Rear projection of second cylindrical terminal member of the CPA member 100
124 Rear bottom portion of the CPA member 100
130a Seal in first cylindrical terminal member of the CPA member 100
130b Seal in second cylindrical terminal member of the CPA member 100
132a Protrusion in first cylindrical terminal member of the CPA member 100
132b Protrusion in second cylindrical terminal member of the CPA member 100
200 First connector housing
201 Upper central portion of first connector housing 200
202a Lateral opening on first side of upper central portion on first connector housing 200
202b Lateral opening on second side of upper central portion on first connector housing 200
204a Inner side wall of lateral opening on first side of upper central portion on first connector housing 200
204b Inner side wall of lateral opening on first side of upper central portion on first connector housing 200
206 Central opening in upper central portion of first connector housing 200
208 Central bridge of upper central portion of first connector housing 200
210 Rear upper projection of elongated flexible portion of first connector housing 200
212 Elongated flexible member of first connector housing 200
214a First central protrusion on first side of the elongated flexible member 212
214b First central protrusion on second side of the elongated flexible member 212
216a Second central protrusion on first side of the elongated flexible member 212
216b Second central protrusion on second side of the elongated flexible member 212
218 Opening of first connector housing 200
220 Wall of first connector housing 200
222 Rear end cover of first connector housing 200
300 Second connector housing
301 Upper central portion of second connector housing 300
302a Lateral opening on first side of upper central portion on second connector housing 300
302b Lateral opening on second side of upper central portion on second connector housing 300
303a First inner portion of inner seal 304 of second connector housing 300
303b Second inner portion of inner seal 304 of second connector housing 300
304 Inner seal of upper central portion on second connector housing 300
306 Front cap of upper central portion on second connector housing 300
308 Top wall of upper central portion of second connector housing 300
310 Rear wall of upper central portion of second connector housing 300
314 Side wall of second connector housing 300
316a Lateral side protrusion of front cap of upper central portion on first side of second connector housing 300
316b Lateral side protrusion of front cap of upper central portion on second side of second connector housing 300
318a Lateral side opening on first side of second connector housing 300
318b Lateral side opening on second side of second connector housing 300
320 Rear end cover of second connector housing 300
402a First terminal pin of second connector housing 300
402b Second terminal pin of second connector housing 300
404 Circuit bridge
406a First terminal pin barb anchor
406b Second terminal pin barb anchor
500a Wire connected to first terminal socket of the CPA member 100
500b Wire connected to second terminal socket of the CPA member 100
600a First terminal socket of the CPA member 100
600b Second terminal socket of the CPA member 100

I claim:
1. A connector position assurance (CPA) member, comprising:
a first member having a first terminal configured to conduct electricity;
a second member having a second terminal configured to conduct electricity;
a first flexible unit being spaced apart from the first member, extending next to the first member, and having at least one protrusion, and
a second flexible unit being spaced apart from the second member, extending next to the second member and having at least one protrusion, wherein the first and second terminals are not electrically connected to each other.

2. A connector position assurance (CPA) member, comprising:
a first member having a first terminal configured to conduct electricity;
a second member having a second terminal configured to conduct electricity; and
a flexible unit having at least one protrusion, wherein the first and second terminals are not electrically connected to each other, wherein the CPA member is in a pre-lock position when:
the CPA member is coupled with a first housing and the at least one protrusion of the flexible unit engages with a first protrusion in the first housing;

the first housing is coupled with a second housing; and
the first terminal is not electrically connected to the second terminal by an electrical conductor in the second housing.

3. The connector position assurance (CPA) member of claim 2, wherein the CPA member is in a full-lock position when:
the CPA member is coupled with the first housing, the at least one protrusion of the flexible unit engages with the first protrusion in the first housing and engages with a second protrusion in the first housing;
the first housing is coupled with the second housing; and
the first terminal is electrically connected to the second terminal by the electrical conductor in the second housing.

4. The connector position assurance (CPA) member of claim 3, wherein the first terminal is a terminal socket, the second terminal is a terminal socket, and the electrical conductor in the second housing includes at least two terminal pins.

5. The connector position assurance (CPA) member of claim 3, wherein the first terminal is a terminal pin, the second terminal is a terminal pin, and the electrical conductor in the second housing includes at least two terminal sockets.

6. A connector position assurance (CPA) member, comprising:
a first member having a first terminal configured to conduct electricity,
a second member having a second terminal configured to conduct electricity; and
a flexible unit having at least one protrusion, wherein the first and second terminals are not electrically connected to each other, wherein the at least one protrusion of the flexible unit includes a first CPA protrusion and a second CPA protrusion.

7. The connector position assurance (CPA) member of claim 6, wherein the CPA member is in a pre-lock position when:
the CPA member is coupled with a first housing, the first CPA protrusion engages with a first protrusion in the first housing, and the second CPA protrusion engages with the first protrusion in the first housing;
the first housing is coupled with a second housing; and
the first terminal is not electrically connected to the second terminal by an electrical conductor in the second housing.

8. The connector position assurance (CPA) member of claim 7, wherein the CPA member is in a full-lock position when:
the CPA member is coupled with the first housing, the first CPA protrusion engages with the first protrusion in the first housing, the second CPA protrusion engages with the first protrusion in the first housing, and the first CPA protrusion engages with a second protrusion in the first housing;
the first housing is coupled with the second housing; and
the first terminal is electrically connected to the second terminal by the electrical conductor in the second housing.

9. A connector position assurance (CPA) member, comprising;
a first member having a first terminal configured to conduct electricity;
a second member having a second terminal configured to conduct electricity; and
a flexible unit having at least one protrusion, wherein the first and second terminals are not electrically connected to each other, wherein the flexible unit includes a first flexible unit and a second flexible unit, the first flexible unit has a first CPA protrusion, and the second flexible unit has a second CPA protrusion.

10. The connector position assurance (CPA) member of claim 9, wherein the CPA member is in a pre-lock position when:
the CPA member is coupled with a first housing, the first CPA protrusion engages with a first protrusion in the first housing, the second CPA protrusion engages with a second protrusion in the first housing;
the first housing is coupled with a second housing; and
the first terminal is not electrically connected to the second terminal by an electrical conductor in the second housing.

11. The connector position assurance (CPA) member of claim 10, wherein the CPA member is in a full-lock position when:
the CPA member is coupled with the first housing, the first CPA protrusion engages with a third protrusion in the first housing, and the second CPA protrusion engages with a fourth protrusion in the first housing;
the first housing is coupled with the second housing; and
the first terminal is electrically connected to the second terminal by the electrical conductor in the second housing.

12. A connector system, comprising:
a connector position assurance (CPA) member having:
a first terminal member including a first electrical conductor,
a second terminal member including a second electrical conductor, and
a first flexible unit being spaced apart from the first terminal member, extending next to the first terminal member, and having at least one protrusion, wherein the first and second electrical conductors are not electrically connected to each other; and
a connector housing having a third electrical conductor, wherein the CPA member is in a pre-lock position when the CPA member has been moved a first distance to mate with the connector housing and the first and second electrical conductors are not electrically connected by the third electrical conductor.

13. The connector system of claim 12, wherein the CPA member is in a full-lock position when the CPA member has been moved a second distance to mate with the connector housing and the first and second electrical conductors are electrically connected by the third electrical conductor, the second distance being greater than the first distance.

14. A connector system, comprising:
a connector position assurance (CPA) member having:
a first terminal member including a first electrical conductor, and
a second terminal member including a second electrical conductor, wherein the first and second electrical conductors are not electrically connected to each other, and
a connector housing having a third electrical conductor wherein the CPA member is in a pre-lock position when the CPA member has been moved a first distance to mate with the connector housing and the first and second electrical conductors are not electrically connected by the third electrical conductor, further comprising:

an additional housing, wherein the CPA member is in the pre-lock position when the CPA member has been moved the first distance to mate with the connector housing and the first and second electrical conductors are not electrically connected by the third electrical conductor, wherein the additional housing is disposed between the connector housing and the CPA member.

15. A connector system, comprising:
a connector position assurance (CPA) member having:
  a first terminal member including a first electrical conductor. and
  a second terminal member including a second electrical conductor, wherein the first and second electrical conductors are not electrically connected to each other, and
a connector housing having a third electrical conductor, wherein the CPA member is in a pre-lock position when the CPA member has been moved a first distance to mate with the connector housing and the first and second electrical conductors are not electrically connected by the third electrical conductor, further comprising:
an additional housing, wherein the CPA member is in the full-lock position when the CPA member has been moved a second distance to mate with the connector housing and the first and second electrical conductors are electrically connected by the third electrical conductor, wherein the additional housing is disposed between the connector housing and the CPA member.

16. A connector position assurance (CPA) member, comprising:
  a first member having a first terminal;
  a second member having a second terminal, wherein the first and second terminals are not electrically connected to each other; and
  a flexible unit being spaced apart from the first member. extending next to the first member, and having at least one protrusion.

17. A connector position assurance (CPA) member, comprising:
  a first member having a first terminal;
  a second member having a second terminal, wherein the first and second terminals are not electrically connected to each other; and
  a flexible unit having at least one protrusion, wherein the CPA member is in a pre-lock position when:
  the CPA member is coupled with a housing and the at least one protrusion of the flexible unit engages with a first protrusion in the housing; and
  the first terminal is not electrically connected to the second terminal by an electrical conductor in the housing.

18. The connector position assurance (CPA) member of claim 17, wherein the CPA member is in a full-lock position when:
  the CPA member is coupled with the housing, the at least one protrusion of the flexible unit engages with the first protrusion in the housing; and
  the first terminal is electrically connected to the second terminal by the electrical conductor in the housing.

19. A method of operating a connector system and electrical circuit for a connector position assurance (CPA) member, comprising the steps of:
  inserting a CPA member into a first housing to a pre-lock position, wherein the CPA member has a first terminal and a second terminal which are not electrically connected to each other;
  coupling the first housing with a second housing;
  moving the CPA member into the second housing to a full-lock position; and
  detecting a closed electrical circuit condition between the first terminal of the CPA member and the second terminal of the CPA member, wherein the CPA member has a flexible unit spaced apart from the first terminal, extending next to the first terminal, and having at least one protrusion.

20. The method of claim 19, wherein the second housing has an electrical conductor configured to conduct electricity between the first and second terminals.

* * * * *